United States Patent
Izukashi

(10) Patent No.: US 12,015,041 B2
(45) Date of Patent: Jun. 18, 2024

(54) SOLID-STATE IMAGING UNIT AND ELECTRONIC APPARATUS

(71) Applicant: SONY SEMICONDUCTOR SOLUTIONS CORPORATION, Kanagawa (JP)

(72) Inventor: Kazutaka Izukashi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 518 days.

(21) Appl. No.: 17/272,875

(22) PCT Filed: Sep. 4, 2019

(86) PCT No.: PCT/JP2019/034794
§ 371 (c)(1),
(2) Date: Mar. 2, 2021

(87) PCT Pub. No.: WO2020/054545
PCT Pub. Date: Mar. 19, 2020

(65) Prior Publication Data
US 2021/0327940 A1    Oct. 21, 2021

(30) Foreign Application Priority Data
Sep. 14, 2018 (JP) ................................ 2018-172282

(51) Int. Cl.
*H01L 27/146* (2006.01)

(52) U.S. Cl.
CPC .. *H01L 27/14623* (2013.01); *H01L 27/14614* (2013.01); *H01L 27/14621* (2013.01);
(Continued)

(58) Field of Classification Search
CPC ............ H01L 27/14623; H01L 27/146–14893
See application file for complete search history.

(56) References Cited

U.S. PATENT DOCUMENTS

2014/0211056 A1* 7/2014 Fan ........................ H04N 25/70
                                                                  257/292
2015/0035028 A1* 2/2015 Fan ................... H01L 27/14638
                                                                  257/292

(Continued)

FOREIGN PATENT DOCUMENTS

CN         105009291 A    10/2015
CN         107431075 A    12/2017
(Continued)

OTHER PUBLICATIONS

International Search Report prepared by the Japan Patent Office dated Oct. 29, 2019, for International Application No. PCT/JP2019/034794.

(Continued)

*Primary Examiner* — Erik Kielin
(74) *Attorney, Agent, or Firm* — Sheridan Ross PC

(57) ABSTRACT

A solid-state imaging unit according to one embodiment of the present disclosure includes two or more pixels. The pixels each include a photoelectric conversion section, a charge holding section, and a transfer transistor. The charge holding section holds a charge transferred from the photoelectric conversion section. The transfer transistor transfers the charge from the photoelectric conversion section to the charge holding section. The pixels each include two or more light-blocking sections disposed in layers between the light receiving surface and the charge holding section and are different from each other. The two or more light-blocking sections are provided at positions at which the two or more light-blocking sections do not block entry, into the photoelectric conversion section, of the light having entered via the light receiving surface and at which the two or more light-blocking sections do not provide a gap when viewed from the light receiving surface.

8 Claims, 29 Drawing Sheets

(52) U.S. Cl.
CPC .... *H01L 27/14627* (2013.01); *H01L 27/1464* (2013.01); *H01L 27/14645* (2013.01); *H01L 27/14685* (2013.01); *H01L 27/14689* (2013.01)

(56) References Cited

U.S. PATENT DOCUMENTS

| | | | |
|---|---|---|---|
| 2018/0033809 A1 | 2/2018 | Tayanaka et al. | |
| 2020/0235146 A1* | 7/2020 | Yoshita | H01L 27/14603 |
| 2021/0183931 A1* | 6/2021 | Fujii | H04N 25/76 |

FOREIGN PATENT DOCUMENTS

| | | | | |
|---|---|---|---|---|
| JP | H09-138397 | 5/1997 | | |
| JP | 2009194361 A | 8/2009 | | |
| JP | 2013-098446 | 5/2013 | | |
| JP | 2015228510 A | 12/2015 | | |
| TW | 201003907 A | 1/2010 | | |
| TW | 201507122 A | 2/2015 | | |
| TW | 201631751 A | 9/2016 | | |
| WO | WO 2016/136486 | 9/2016 | | |
| WO | WO 2018/136732 | 7/2018 | | |
| WO | WO-2018163732 A1 * | 9/2018 | ........... | H01L 27/146 |
| WO | WO-2019093122 A1 * | 5/2019 | ......... | H01L 21/3205 |

OTHER PUBLICATIONS

Notice of Grant for China Patent Application No. 201980038248.8, dated Mar. 29, 2024, 7 pages.

* cited by examiner

SOLID-STATE IMAGING UNIT AND ELECTRONIC APPARATUS

CROSS REFERENCE TO RELATED APPLICATIONS

This application is a national stage application under 35 U.S.C. 371 and claims the benefit of PCT Application No. PCT/JP2019/034794 having an international filing date of 4 Sep. 2019, which designated the United States, which PCT application claimed the benefit of Japanese Patent Application No. 2018-172282, filed 14 Sep. 2018, the entire disclosures of each of which are incorporated herein by reference.

TECHNICAL FIELD

The present disclosure relates to a solid-state imaging unit and an electronic apparatus.

BACKGROUND ART

There has been proposed to provide, in a solid-state imaging unit, a light-blocking section between a photoelectric conversion section and a charge holding section in order to prevent entry of light from a light receiving surface into the charge holding section to which charges accumulated in the photoelectric conversion section are transferred (e.g., see PTL 1).

CITATION LIST

Patent Literature

PTL 1: International Publication WO2016/136486

SUMMARY OF THE INVENTION

Incidentally, in a field of the solid-state imaging unit described above, it is desired to reduce noise caused by entry of light into the charge holding section. Therefore, it is desirable to provide a solid-state imaging unit that makes it possible to reduce noise caused by entry of light into a charge holding section, and an electronic apparatus including the solid-state imaging unit.

A solid-state imaging unit according to one embodiment of the present disclosure includes a light receiving surface and two or more pixels disposed to oppose the light receiving surface. The pixels each include a photoelectric conversion section, a charge holding section, and a transfer transistor. The photoelectric conversion section performs photoelectric conversion on light having entered via the light receiving surface. The charge holding section holds a charge transferred from the photoelectric conversion section. The transfer transistor includes a vertical gate electrode reaching the photoelectric conversion section. The transfer transistor transfers the charge from the photoelectric conversion section to the charge holding section. The pixels each further include two or more light-blocking sections. The two or more light-blocking sections are disposed in layers that are provided between the light receiving surface and the charge holding section and are different from each other. The two or more light-blocking sections are provided at positions at which the two or more light-blocking sections do not block entry, into the photoelectric conversion section, of the light having entered via the light receiving surface and at which the two or more light-blocking sections do not provide a gap when viewed from the light receiving surface.

An electronic apparatus according to an embodiment of the present disclosure includes a solid-state imaging unit that outputs a pixel signal based on entering light, and a signal processing circuit that processes the pixel signal. The solid-state imaging unit provided in the electronic apparatus has a configuration same as that of the solid-state imaging unit described above.

In the solid-state imaging unit and the electronic apparatus according to one embodiment of the present disclosure, the two or more light-blocking sections that block the entry of the light having entered via the light receiving surface into the charge holding section are provided. Thus, for example, also in a case where a structure that prevents light blocking, such as a vertical gate electrode, is provided, appropriate adjustment of the arrangement of the two or more light-blocking sections allows for blocking of the entry, into the charge holding section, of the light having entered via the light receiving surface.

According to the solid-state imaging unit and the electronic apparatus of one embodiment of the present disclosure, the two or more light-blocking sections that block the entry, into the charge holding section, of the light having entered via the light receiving surface are provided. Therefore, it is possible to reduce noise caused by the entry of the light into the charge holding section. Note that effects of the present technology are not necessarily limited to the effects described here, and may include any of effects described herein.

MODES FOR CARRYING OUT THE INVENTION

Hereinafter, an embodiment of the present disclosure is described in detail with reference to the drawings. Note that the description is given in the following order.

Figure 2:
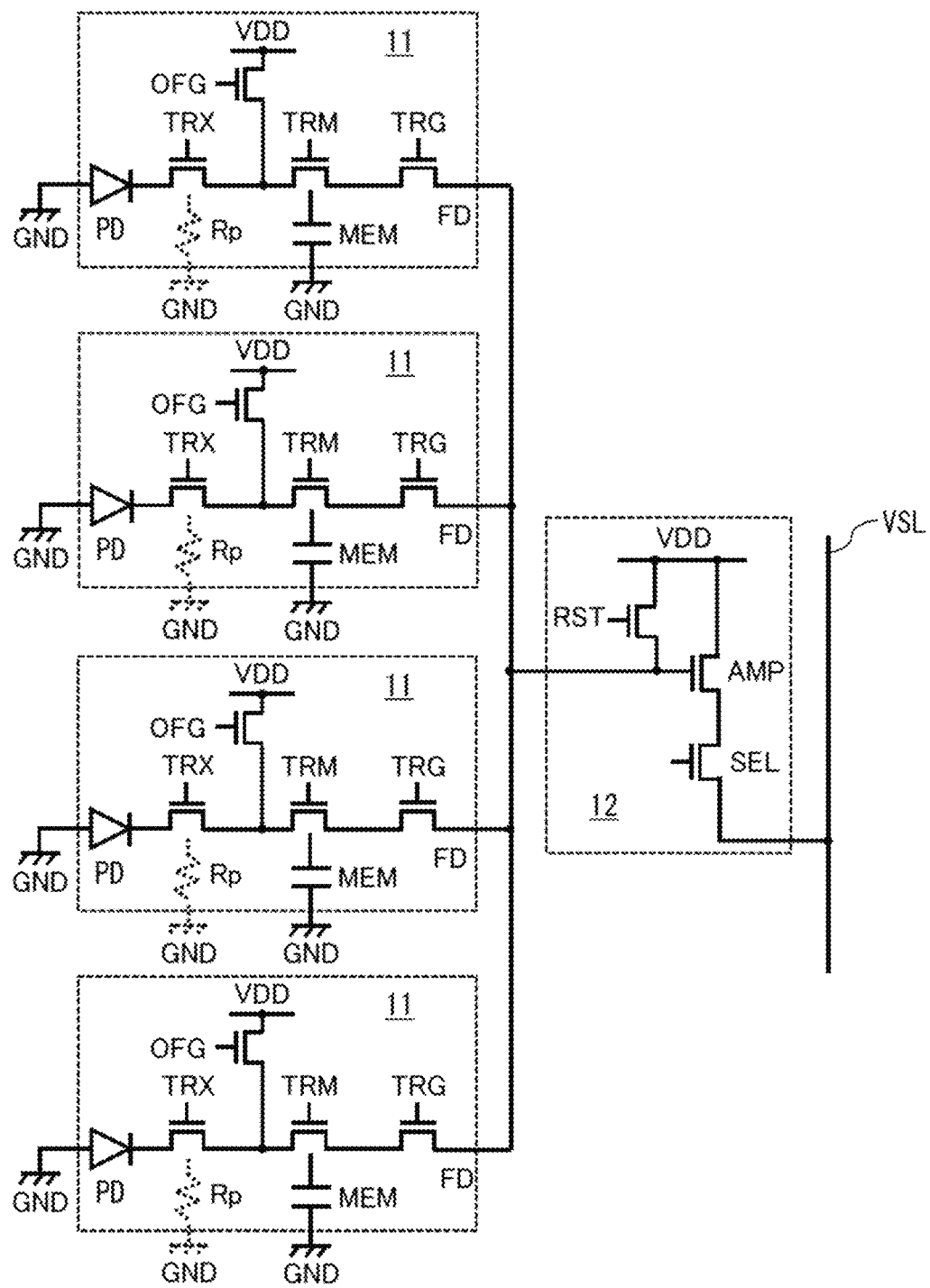
FIG. 2 is a diagram illustrating an example of a circuit configuration of a sensor pixel in FIG. 1.
Figure 3:
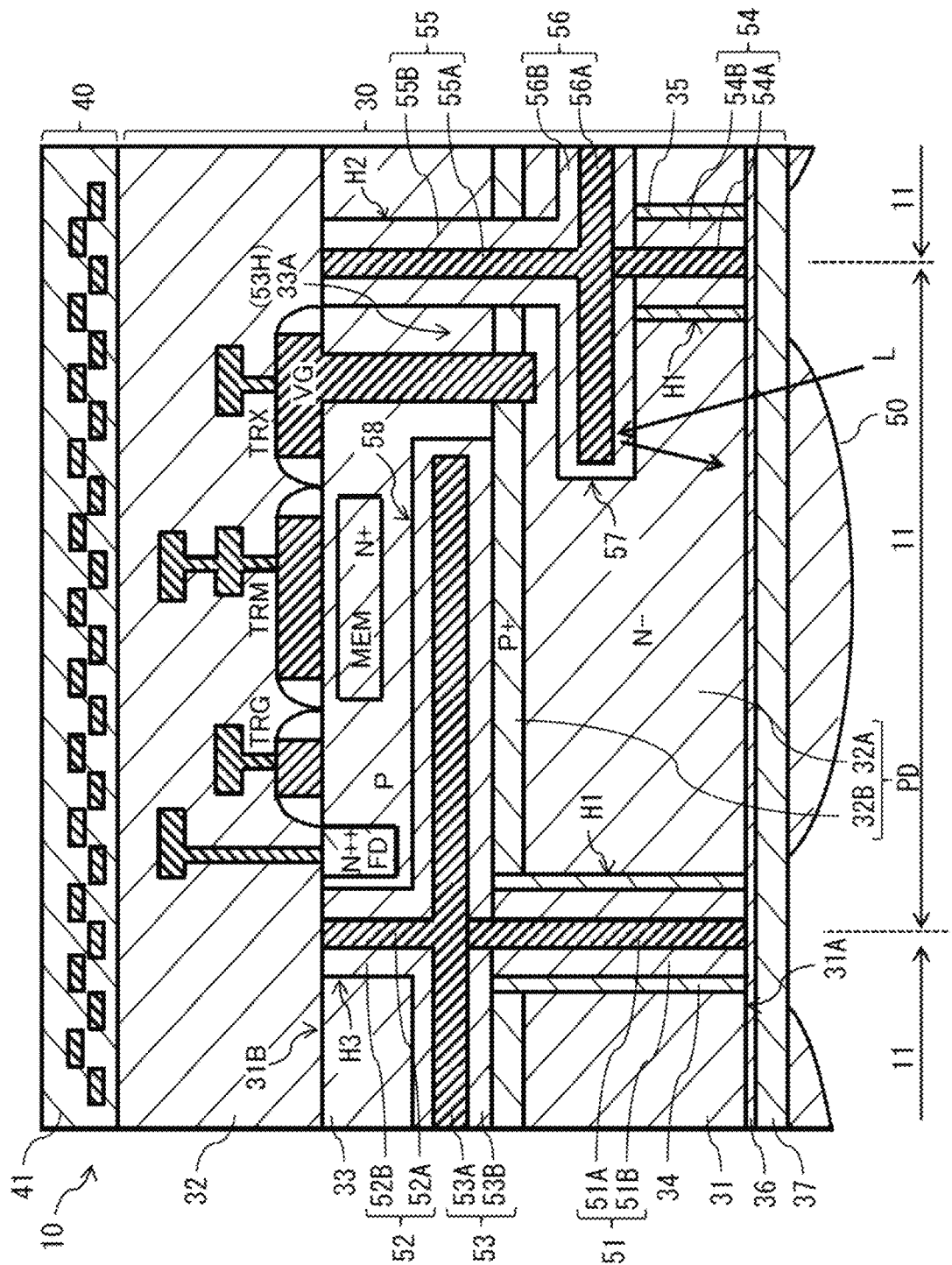
FIG. 3 is a diagram illustrating an example of a cross-sectional configuration of the sensor pixel in FIG. 1.
Figure 4:
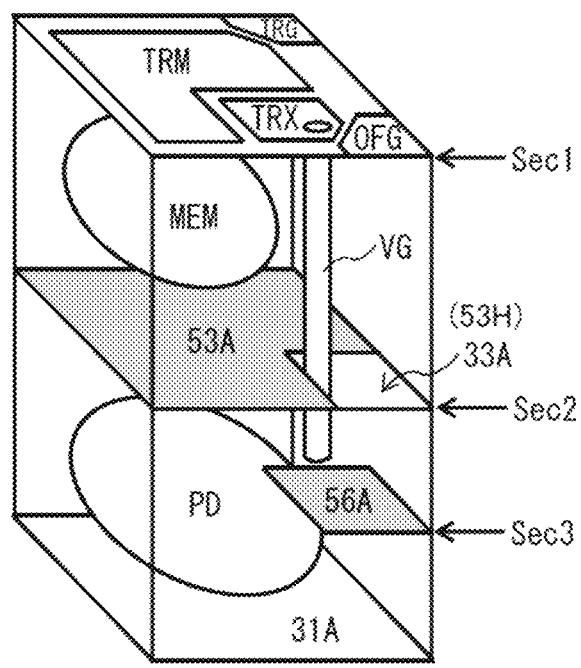
FIG. 4 is a perspective view of an example of a schematic configuration of the sensor pixel in FIG. 1.
Figure 25:
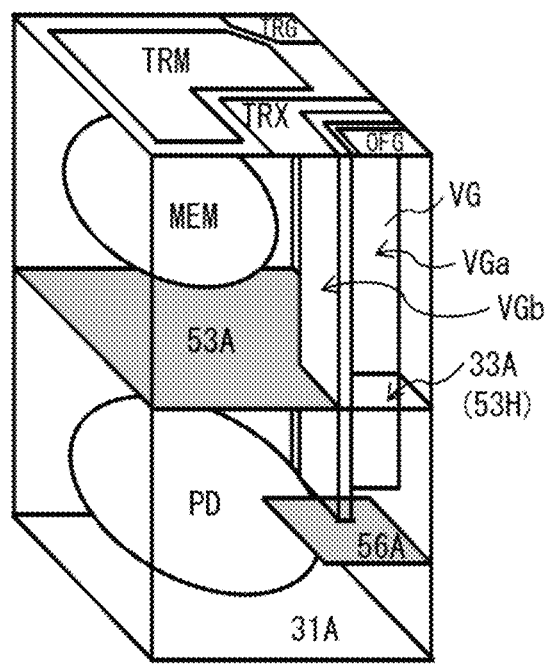
FIG. 25 is a perspective view of a modification of the schematic configuration of the sensor pixel in FIG. 4.
Figure 26:
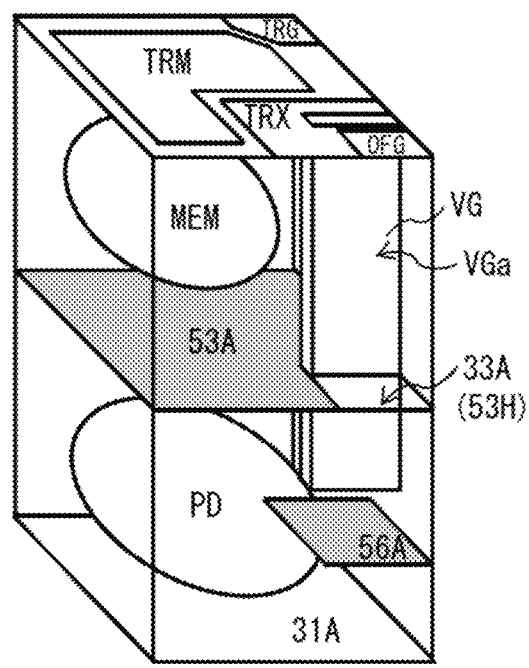
FIG. 26 is a perspective view of a modification of the schematic configuration of the sensor pixel in FIG. 4.
Figure 27:
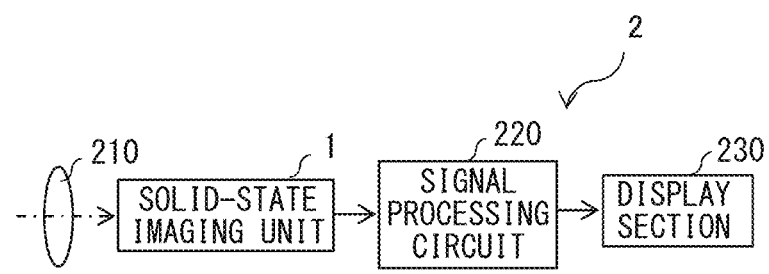
FIG. 27 is a diagram illustrating an example of a schematic configuration of an imaging system including an imaging unit according to any of the embodiment and the modifications thereof described above.
Figure 28:
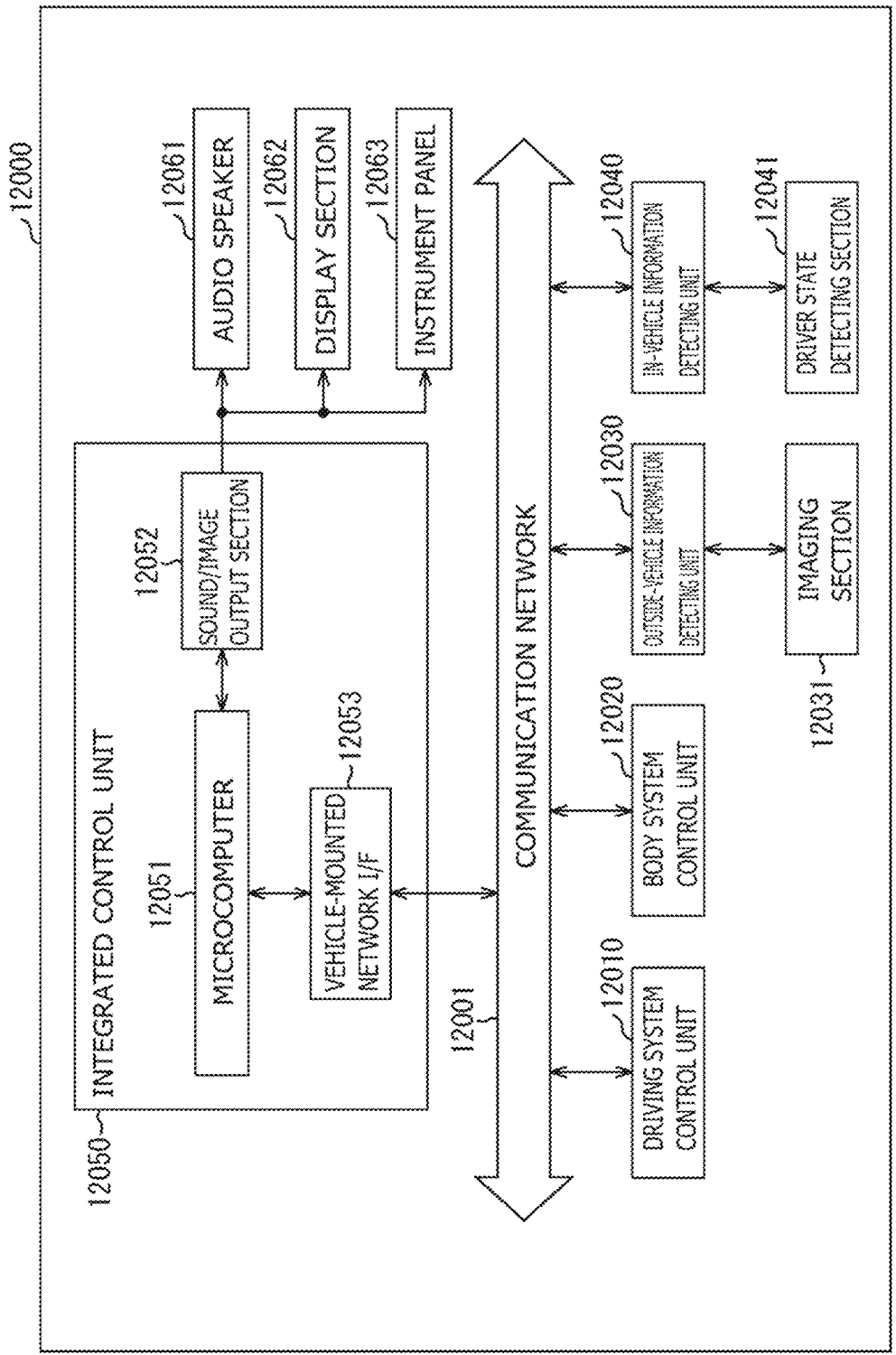
FIG. 28 is a block diagram depicting an example of schematic configuration of a vehicle control system.
Figure 29:
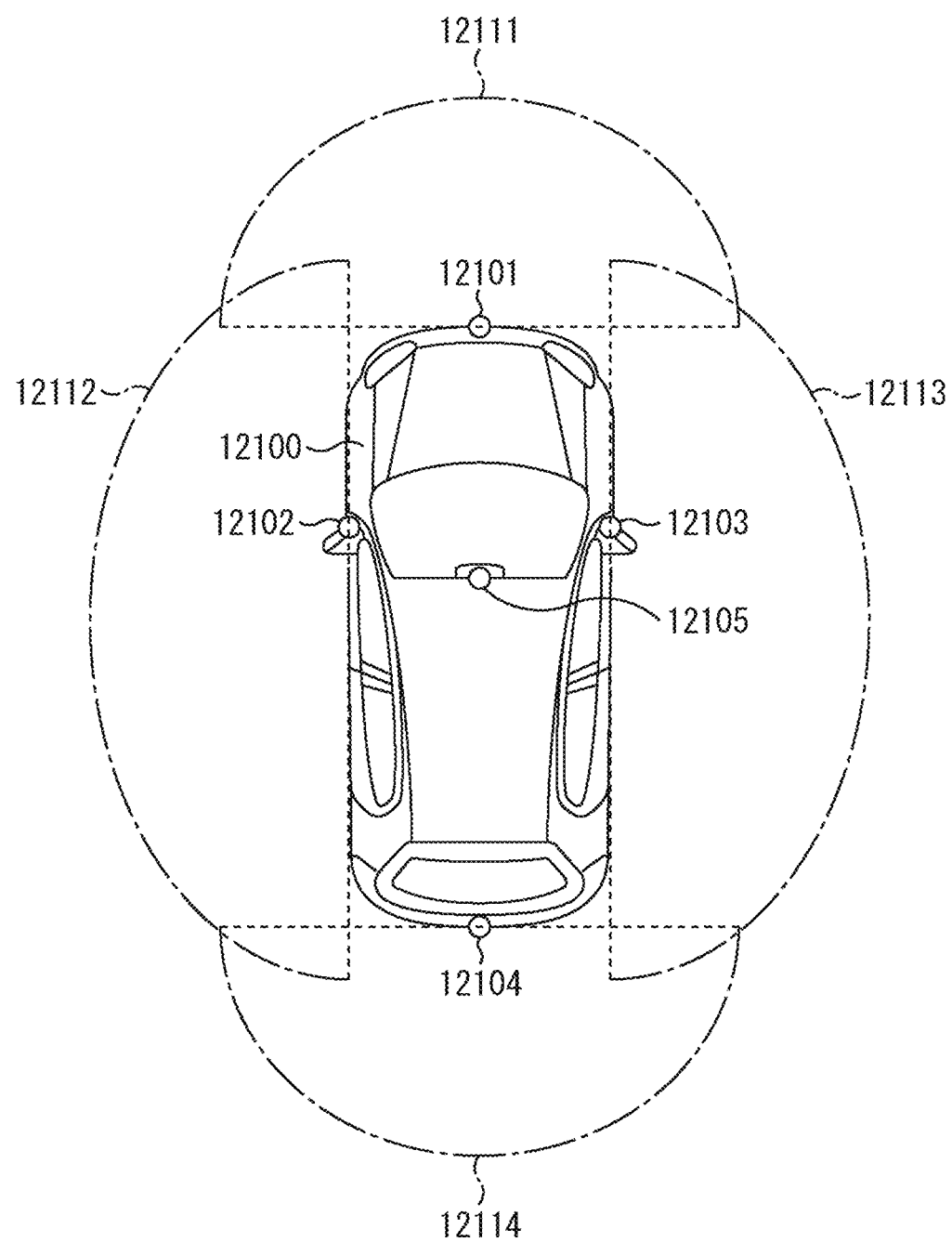
FIG. 29 is a diagram of assistance in explaining an example of installation positions of an outside-vehicle information detecting section and an imaging section.

1. Embodiment (Solid-state Imaging Unit) . . . FIG. 1 to FIG. 24
2. Modifications (Solid-state Imaging Unit) . . . FIG. 25 and FIG. 26
3. Application Example (Imaging System) . . . FIG. 27
4. Examples of Application to Mobile Body . . . FIG. 28 and FIG. 29

<1. Embodiment>
[Configuration]

A solid-state imaging unit 1 according to an embodiment of the present disclosure is described. The solid-state imaging unit 1 is, for example, a back-illuminated image sensor of a global shutter scheme including a CMOS (Complementary Metal Oxide Semiconductor) image sensor or the like. The solid-state imaging unit 1 receives light from a subject and performs photoelectric conversion on the light to generate an image signal, thereby capturing an image. The solid-state imaging unit 1 outputs a pixel signal based on entering light.

The global shutter scheme is a scheme of performing global exposure in which, basically, exposure is started simultaneously for all pixels and the exposure is terminated simultaneously for all the pixels. Here, all the pixels refer to all pixels in a part appearing in an image, and dummy pixels, etc. are excluded. Further, the global shutter scheme also includes a scheme of moving a region to perform the global exposure while performing the global exposure simultaneously for not all the pixels but in units of a plurality of rows (for example, several tens of rows), if a time difference or image distortion is sufficiently small to the extent that it does not pose a problem. Further, the global shutter scheme also includes a scheme of performing the global exposure on not all of the pixels in the part appearing in the image, but on pixels in a predetermined region.

The back-illuminated image sensor is an image sensor having a configuration in which a photoelectric conversion section is disposed between a light receiving surface and a wiring layer. The light receiving surface receives light from the subject. The wiring layer is a layer on which a wiring of a transistor driving each of the pixels or the like is provided. The photoelectric conversion section is a photodiode or the like that receives the light from the subject and converts it into an electric signal. Note that the present disclosure is not limitedly applied to the CMOS image sensor.

Figure 1:
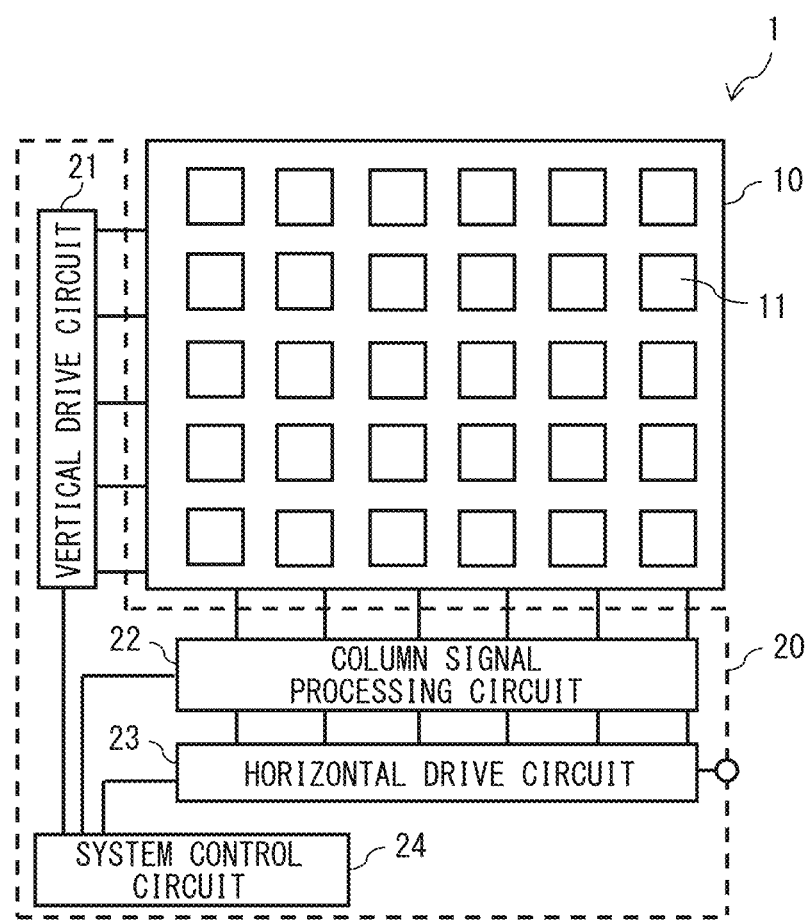
FIG. 1 is a diagram illustrating an example of a schematic configuration of a solid-state imaging unit according to an embodiment of the present disclosure.

FIG. 1 illustrates an example of a schematic configuration of the solid-state imaging unit 1 according to the embodiment of the present disclosure. The solid-state imaging unit 1 includes a pixel array section 10 in which two or more sensor pixels 11 that perform photoelectric conversion are disposed in a matrix. The sensor pixel 11 corresponds to one specific example of a "pixel" of the present disclosure. FIG. 2 illustrates an example of a circuit configuration of the sensor pixels 11 and a read circuit 12 (which will be described later). FIG. 3 illustrates an example of a cross-sectional configuration of the sensor pixels 11 and the read circuit 12. The solid-state imaging unit 1 includes, for example, two substrates (a first substrate 30 and a second substrate 40) that are adhered to each other.

The first substrate 30 includes the two or more sensor pixels 11 on a semiconductor substrate 31. The two or more sensor pixels 11 are provided in a matrix at positions opposing a back surface (a light receiving surface 31A) of the semiconductor substrate 31. The first substrate 30 further includes two or more read circuits 12 on the semiconductor substrate 31. The read circuits 12 each output a pixel signal based on a charge outputted from the sensor pixel 11. The two or more read circuits 12 are provided, for example, one for each four sensor pixels 11. In this case, the four sensor pixels 11 share the single read circuit 12. Here, "share" refers to that outputs of the four sensor pixels 11 are supplied to the common read circuit 12. The read circuit 12 includes, for example, a reset transistor RST, a selection transistor SEL, and an amplifying transistor AMP.

The first substrate 30 includes two or more pixel driving lines extending in a row direction, and two or more data output lines VSL extending in a column direction. The pixel driving line is a wire that receives a control signal controlling the output of the charges accumulated in the sensor pixel 11. The pixel driving line extends, for example, in the row direction. The data output line VSL is a wire supplying, to a logic circuit 20, a pixel signal supplied from each of the read circuits 12. The data output line VSL extends, for example, in the column direction.

The second substrate 40 includes the logic circuit 20 on a semiconductor substrate 41. The logic circuit 20 processes the pixel signal. The logic circuit 20 includes, for example, a vertical drive circuit 21, a column signal processing circuit 22, a horizontal drive circuit 23, and a system control circuit 24. The logic circuit 20 (specifically, the horizontal drive circuit 23) outputs an output voltage for each of the sensor pixels 11 to outside.

The vertical drive circuit 21 selects, for example, the two or more sensor pixels 11 sequentially for each predetermined pixel row unit. The "predetermined pixel row unit" refers to pixel rows that allow for pixel selection at the same address. For example, in a case where two or more sensor pixels 11 share one read circuit 12, if a layout of the two or more sensor pixels 11 sharing the read circuit 12 is two pixel rows×n pixel columns (n is an integer of 1 or greater), the "predetermined pixel row unit" refers to the two pixel rows. Similarly, if the layout of the two or more sensor pixels 11 sharing the read circuit 12 is four pixel rows×n pixel columns (n is an integer of 1 or greater), the "predetermined pixel row unit" refers to the four pixel rows.

The column signal processing circuit 22 performs, for example, a correlated double sampling (Correlated Double Sampling: CDS) process on the pixel signal supplied from each of the sensor pixels 11 of the row selected by the vertical drive circuit 21. The column signal processing circuit 22 performs, for example, the CDS process to extract a signal level of the pixel signal, and holds pixel data based on a light reception amount of each of the sensor pixels 11. The column signal processing circuit 22 includes, for example, a column signal processing section 22A for each data output line VSL. The column signal processing section 22A includes, for example, a single-slope A/D converter. The single-slope A/D converter includes, for example, a comparator and a counter circuit. The horizontal drive circuit 23 outputs, for example, the pixel data held in the column signal processing circuit 22 sequentially to the outside. The system control circuit 24 controls, for example, driving of respective blocks (the vertical drive circuit 21, the column signal processing circuit 22, and the horizontal drive circuit 23) in the logic circuit 20.

The sensor pixels 11 have components same as each other. The sensor pixels 11 each include, for example, a photodiode PD, a first transfer transistor TRX, a second transfer transistor TRM, a charge holding section MEM, a third transfer transistor TRG, a floating diffusion FD, and a discharge transistor OFG. The first transfer transistor TRX, the second transfer transistor TRM, the third transfer transistor TRG, and the discharge transistor OFG are, for example, NMOS (Metal Oxide Semiconductor) transistors. The photodiode PD corresponds to one specific example of a "photoelectric converter" of the present disclosure. The first transfer transistor TRX corresponds to one specific example of a "transfer transistor" of the present disclosure.

The photodiode PD performs photoelectric conversion on light L having entered via the light receiving surface 31A. The photodiode PD performs the photoelectric conversion to generate a charge based on a light reception amount. The photodiode PD is, for example, a PN-junction photoelectric converter including an N-type semiconductor region 32A and a P-type semiconductor region 32B that are provided in the semiconductor substrate 31. A cathode of the photodiode PD is electrically coupled to a source of the first transfer transistor TRX. An anode of the photodiode PD is electrically coupled to a reference potential line (e.g., ground GND).

The first transfer transistor TRX is coupled between the photodiode PD and the second transfer transistor TRM. The first transfer transistor TRX transfers, in response to a control signal applied to a gate electrode (a vertical gate electrode VG), the charge accumulated in the photodiode PD to the second transfer transistor TRM. The first transfer transistor TRX transfers the charge from the photodiode PD to the charge holding section MEM. The first transfer transistor TRX includes the vertical gate electrode VG. A drain of the first transfer transistor TRX is electrically coupled to a source of the second transfer transistor TRM. A gate of the first transfer transistor TRX is coupled to the pixel driving line.

The second transfer transistor TRM is coupled between the first transfer transistor TRX and the third transfer transistor TRG. The second transfer transistor TRM controls, in response to a control signal applied to the gate electrode, a potential of the charge holding section MEM. For example, when the second transfer transistor TRM is turned on, the potential of the charge holding section MEM is deepened, and when the second transfer transistor TRM is turned off, the potential of the charge holding section MEM becomes shallow. Further, for example, when the first transfer transistor TRX and the second transfer transistor TRM are turned on, the charges accumulated in the photodiode PD are transferred to the charge holding section MEM via the first transfer transistor TRX and the second transfer transistor TRM. A drain of the second transfer transistor TRM is electrically coupled to a source of the third transfer transistor TRG. A gate of the second transfer transistor TRM is coupled to the pixel driving line.

The charge holding section MEM is a region in which the charge accumulated in the photodiode PD is temporarily held in order to achieve a global shutter function. The charge holding section MEM holds the charge transferred from the photodiode PD.

The third transfer transistor TRG is coupled between the second transfer transistor TRM and the floating diffusion FD. The third transfer transistor TRG transfers, in response to a control signal applied to the gate electrode, the charge held in the charge holding section MEM to the floating diffusion FD. For example, when the second transfer transistor TRM is turned off and the third transfer transistor TRG is turned on, the charge held in the charge holding section MEM is transferred to the floating diffusion FD via the second transfer transistor TRM and the third transfer transistor TRG. A drain of the third transfer transistor TRG is electrically coupled to the floating diffusion FD. A gate of the third transfer transistor TRG is coupled to the pixel driving line.

The floating diffusion FD is a floating diffusion region in which the charge outputted from the photodiode PD via the third transfer transistor TRG is temporarily held. Coupled to the floating diffusion FD is, for example, the reset transistor RST. Coupled as well to the floating diffusion FD is, for example, the vertical signal line VSL via the amplifying transistor AMP and the selection transistor SEL.

In the discharge transistor OFG, a drain is coupled to a power supply line VDD, and a source is coupled between the first transfer transistor TRX and the second transfer transistor TRM. The discharge transistor OFG initializes (resets) the photodiode PD in response to a control signal applied to a gate electrode. For example, when the first transfer transistor TRX and the discharge transistor OFG are turned on, a potential of the photodiode PD is reset to a potential level of the power supply line VDD. That is, the photodiode PD is initialized. Further, for example, the discharge transistor OFG forms an overflow path between the first transfer transistor TRX and the power supply line VDD, and discharges a charge overflowing from the photodiode PD to the power supply line VDD.

In the reset transistor RST, a drain is coupled to the power supply line VDD, and a source is coupled to the floating diffusion FD. The reset transistor RST initializes (resets) each of the regions from the charge holding section MEM to the floating diffusion FD in response to a control signal applied to a gate electrode. For example, when the third transfer transistor TRG and the reset transistor RST are turned on, potentials of the charge holding section MEM and the floating diffusion FD are reset to the potential level of the power supply line VDD. That is, the charge holding section MEM and the floating diffusion FD are initialized.

The amplifying transistor AMP has a gate electrode coupled to the floating diffusion FD, and a drain coupled to the power supply line VDD. The amplifying transistor AMP serves as an input section of a source follower circuit which reads the charge obtained by the photoelectric conversion at the photodiode PD. That is, the amplifying transistor AMP has a source coupled to the vertical signal line VSL via the selection transistor SEL, thereby providing the source follower circuit together with a constant current source coupled to one end of the vertical signal line VSL.

The selection transistor SEL is coupled between the source of the amplifying transistor AMP and the vertical signal line VSL. The gate electrode of the selection transistor SEL receives a control signal as a selection signal. The selection transistor SEL is brought into a conductive state when the control signal is turned on, and the sensor pixel 11 coupled to the selection transistor SEL is brought into a selected state. When the sensor pixel 11 is brought into the selected state, the pixel signal outputted from the amplifying transistor AMP is read out to the column signal processing circuit 22 via the vertical signal line VSL.

Figure 5:
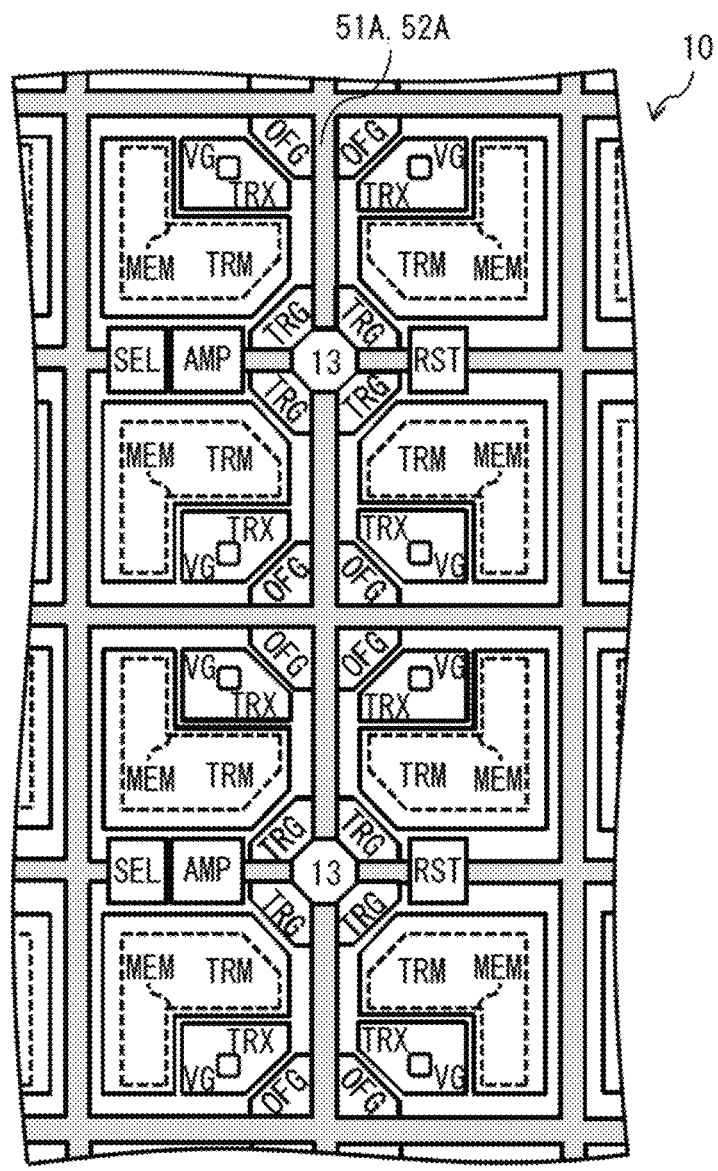
FIG. 5 is a diagram illustrating an example of a planar configuration in Sec1 in FIG. 4.
Figure 6:
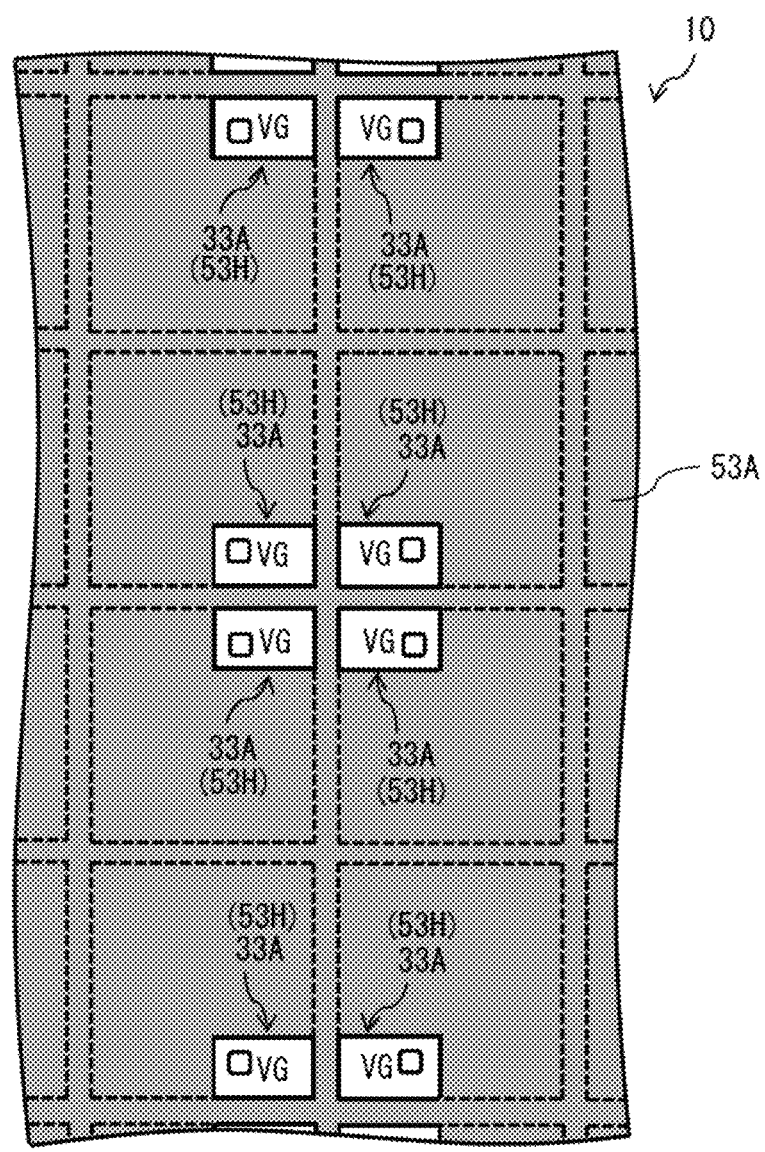
FIG. 6 is a diagram illustrating an example of a planar configuration in Sec2 in FIG. 4.
Figure 7:
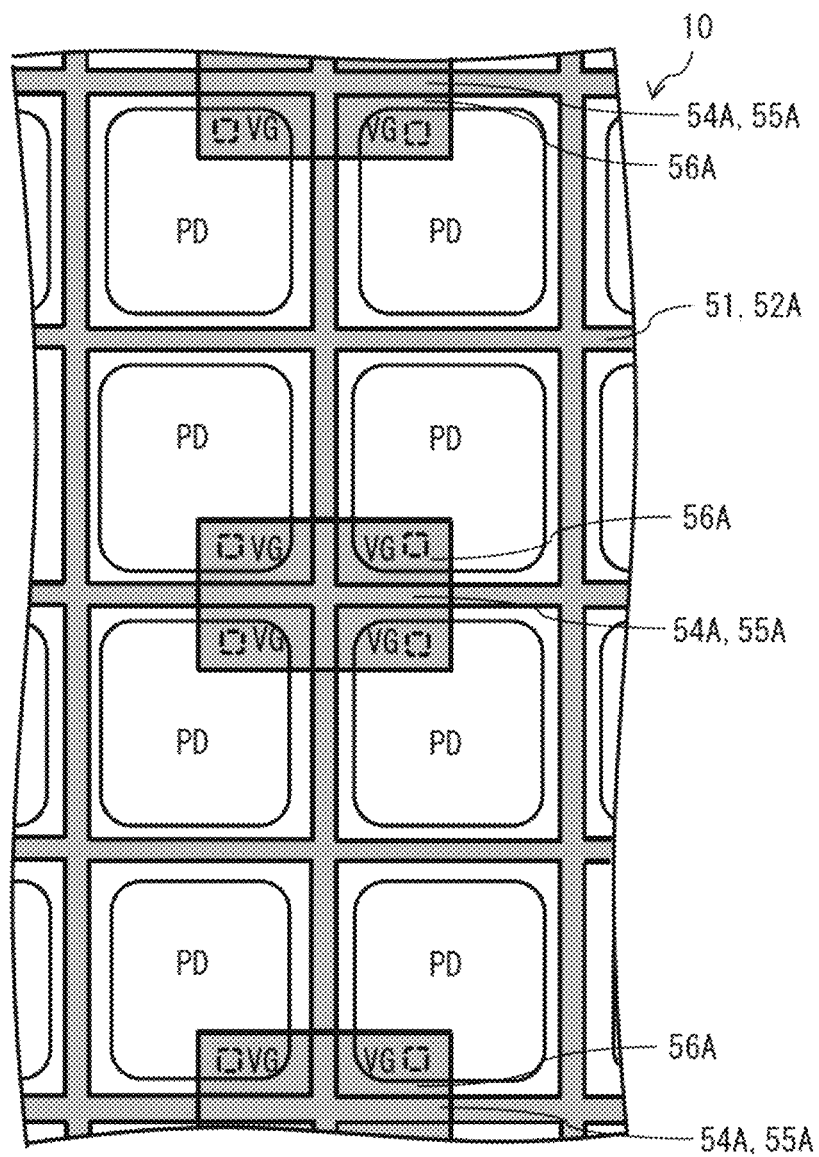
FIG. 7 is a diagram illustrating an example of a planar configuration in Sec3 in FIG. 4.

Next, a detailed description is given of the configuration of the sensor pixel 11. FIG. 4 is a perspective view of an example of a schematic configuration of the sensor pixel 11. FIG. 5 illustrates an example of a planar configuration in Sec1 in FIG. 4. FIG. 6 illustrates an example of a planar configuration in Sec2 in FIG. 4. FIG. 7 illustrates an example of a planar configuration in Sec3 in FIG. 4. Note that, in FIG. 5, the layout of the various transistors (the reset transistor RST, the amplifying transistor AMP, and the selection transistor SEL) included in the read circuit 12, and the layout of metal embedded sections 34A and 36A which will be described later are superimposed on the planar configuration in Sec1 in FIG. 4. Further, FIG. 5 illustrates a case where four floating diffusions FD sharing the read circuit 12 are electrically coupled to a common extracting electrode 13. Further, in FIG. 6, the layout of the metal embedded sections 34A and 36B which will be described later are superimposed on the planar configuration in Sec2 in FIG. 4.

The first substrate 30 includes a semiconductor layer 33 and an insulating layer 32 stacked in this order on the semiconductor substrate 31. That is, the insulating layer 32 is formed in contact with an upper surface of the semiconductor layer 33. Formed on the upper surface of the semiconductor layer 33 are the first transfer transistor TRX, the second transfer transistor TRM, the charge holding section MEM, the third transfer transistor TRG, the floating diffusion FD, and the discharge transistor OFG. Formed in the vicinity of the upper surface of the semiconductor layer 33 is the charge holding section MEM. Therefore, the upper surface of the semiconductor layer 33 serves as a formation surface 31B for the first transfer transistor TRX, etc. Note that, the stack including the semiconductor substrate 31 and the semiconductor layer 33 may also be regarded as semiconductor substrates. In this case, an upper surface of the stack (the semiconductor substrate) including the semiconductor substrate 31 and the semiconductor layer 33 serves as the formation surface 31B, and a back surface of the stack (the semiconductor substrate) including the semiconductor substrate 31 and the semiconductor layer 33 serves as the light receiving surface 31A. In this case, each of the sensor pixels 11 is formed in the stack (the semiconductor substrate) including the semiconductor substrate 31 and the semiconductor layer 33.

Provided in the insulating layer 32 are the gate electrodes of the first transfer transistor TRX, the second transfer transistor TRM, the third transfer transistor TRG, and the discharge transistor OFG, wirings coupled to these gate electrodes, and the like. The gate electrodes of the first transfer transistor TRX, the second transfer transistor TRM, the third transfer transistor TRG, and the discharge transistor OFG, and the wirings coupled to these gate electrodes include, for example, a metal material. Note that, the gate electrode (the vertical gate electrode VG) of the first transfer transistor TRX may include polysilicon.

The semiconductor substrates 31 and 41 each include, for example, a silicon substrate. The semiconductor layer 33 includes, for example, a silicon layer formed by epitaxial crystal growth. The semiconductor substrate 31 includes a P-type semiconductor region 32B in a part of the upper surface and the vicinity thereof. The semiconductor substrate 31 includes an N-type semiconductor region 32A in a region deeper than the P-type semiconductor region 32B. The N-type semiconductor region 32A differs from the P-type semiconductor region 32B in conductivity type. The P-type semiconductor region 32B is provided on a surface side, of the semiconductor substrate 31, opposite to the light receiving surface 31A. The conductivity type of the P-type semiconductor region 32B is a P-type. The conductivity type of the N-type semiconductor region 32A is a conductivity type different from that of the P-type semiconductor region 32B, which is an N-type. The semiconductor substrate 31 includes, in the P-type semiconductor region 32B, for example, a floating diffusion FD and a charge holding section MEM of the respective conductivity types different from that of the P-type semiconductor region 32B. The gate electrode (the vertical gate electrode VG) of the first transfer transistor TRX is formed to extend in a thickness direction (a normal direction) of the semiconductor substrate 31 from the upper surface (the formation surface 31B) of the semiconductor layer 33. The gate electrode (the vertical gate electrode VG) of the first transfer transistor TRX extends from the formation surface 31B to a depth reaching the N-type semiconductor region 32A. The gate electrode (the vertical gate electrode VG) of the first transfer transistor TRX has, for example, a rod shape extending in the thickness direction (the normal direction) of the semiconductor substrate 31.

The first substrate 30 further includes, for example, a fixed charge film 36 that is in contact with the back surface (the light receiving surface 31A) of the semiconductor substrate 31. The fixed charge film 36 has a negative fixed charge, in order to suppress generation of a dark current resulting from an interface state on the light receiving surface 31A side of the semiconductor substrate 31. The fixed charge film 36 includes, for example, an insulating film having a negative fixed charge. Examples of a material for such an insulating film include hafnium oxide, zircon oxide, aluminum oxide, titanium oxide, and tantalum oxide. An electric field induced by the fixed charge film 36 forms a hole accumulation layer on an interface on the light receiving surface 31A side of the semiconductor substrate 31. This hole accumulation layer suppresses generation of an electron from the interface. The first substrate 30 further includes, for example, a color filter 37. The color filter 37 is provided on the light receiving surface 31A side of the semiconductor substrate 31. The color filter 37 is provided in contact with the fixed charge film 36, for example. The color filter 37 is provided at a position opposing the sensor pixel 11 with the fixed charge film 36 therebetween, for example.

Each of the sensor pixels 11 includes a light receiving lens 50 on the back surface (the light receiving surface 31A) side of the semiconductor substrate 31. That is, the solid-state imaging unit 1 includes two or more light receiving lenses 50 provided one by one for the sensor pixels 11. The two or more light receiving lenses 50 are provided one by one for the photodiodes PD. The two or more light receiving lenses 50 are each disposed at a position opposing the photodiode PD. That is, the solid-state imaging unit 1 is a back-illuminated imaging unit. The light receiving lens 50 is, for example, provided in contact with the color filter 37. The light receiving lens 50 is provided, for example, at a position opposing the sensor pixel 11 with the color filter 37 and the fixed charge film 36 therebetween.

The first substrate 30 includes device separators 51, 52, 54, and 55 that each electrically and optically separate two sensor pixels 11 adjacent to each other. The device separators 51, 52, 54, and 55 are each formed to extend in the normal direction (the thickness direction) of the semiconductor substrate 31. The device separators 51 and 52 are stacked in the normal direction (the thickness direction) of the semiconductor substrate 31 in the semiconductor substrate 31 and the semiconductor layer 33. That is, the device separators 51 and 52 are coupled to each other. A structure including the device separators 51 and 52 is formed to extend from the light receiving surface 31A to the formation surface 31B. That is, the structure including the device separators 51 and 52 runs through the semiconductor substrate 31 and the semiconductor layer 33. Similarly, the device separators 54 and 55 are stacked in the normal direction (the thickness direction) of the semiconductor substrate 31 in the semiconductor substrate 31 and the semiconductor layer 33. That is, the device separators 54 and 55 are coupled to each other. A structure including the device separators 54 and 55 is formed to extend from the light receiving surface 31A to the formation surface 31B. That is, the structure including the device separators 54 and 55 runs through the semiconductor substrate 31 and the semiconductor layer 33.

The device separators 51 and 54 are integrally formed. The device separators 51 and 54 are formed to surround the sensor pixel 11 (in particular, the photodiode PD) in a horizontal in-plane direction. The device separators 52 and 55 are integrally formed. The device separators 52 and 55 are formed, for example, to surround the sensor pixel 11 (in particular, the first transfer transistor TRX, the second transfer transistor TRM, the charge holding section MEM, the third transfer transistor TRG, the floating diffusion FD, and the discharge transistor OFG) in the horizontal in-plane direction.

The device separators 51 and 54 are formed, for example, to surround the sensor pixel 11 (in particular, the photodiode PD) in the horizontal in-plane direction. Further, the device separators 51 and 54 are formed to extend in the normal direction (the thickness direction) of the semiconductor substrate 31. The device separators 51 and 54 each include a DTI (Deep Trench Isolation) structure. The DTI has a BDTI (Back DTI) structure formed from the back surface (the light receiving surface 31A) side of the semiconductor substrate 31. The BDTI structure is formed to extend in the normal direction (the thickness direction) of the semiconductor substrate 31. The BDTI structure is formed between two photodiodes PD adjacent to each other. The BDTI structure is provided in a trench H1 provided in the semiconductor substrate 31.

In the device separator 51, the DTI includes an insulating film 51B and a metal embedded section 51A. The insulating film 51B is in contact with an inner wall of the trench H1 provided in the semiconductor substrate 31. The metal embedded section 51A is provided on an inner side of the insulating film 51B. An upper part of the metal embedded section 51A and a lower part of a metal embedded section 52A, which will be described later, are coupled to each other. A composite including the metal embedded section 51A and the metal embedded section 52A described later corresponds to one specific example of a "separator" of the present disclosure. The composite including the metal embedded section 51A and the metal embedded section 52A electrically and optically separates the sensor pixels 11. The composite including the metal embedded section 51A and the metal embedded section 52A is formed to extend from the light receiving surface 31A to the formation surface 31B. That is, the composite including the metal embedded section 51A and the metal embedded section 52A runs through the stack (the semiconductor substrate) including the semiconductor substrate 31 and the semiconductor layer 33.

The insulating film 51B is, for example, an oxide film formed by thermally oxidizing the semiconductor substrate 31. The insulating film 51B includes, for example, silicon oxide. The metal embedded section 51A is an annular metal layer that surrounds the sensor pixel 11 (in particular, the photodiode PD) in the horizontal in-plane direction. The metal embedded section 51A electrically and optically separates two sensor pixels 11 (in particular, photodiodes PD) adjacent to each other. The metal embedded section 51A is formed, for example, by CVD (Chemical Vapor Deposition). The metal embedded section 51A includes, for example, aluminum or an aluminum alloy. The first substrate 30 further includes, for example, a solid phase diffusion layer 34 that is in contact with the surface of the device separator 51 (the trench H1). A conductivity type of the solid phase diffusion layer 34 is a conductivity type different from that of the N-type semiconductor region 32A, and is the P-type. The solid phase diffusion layer 34 is in contact with the P-type semiconductor region 32B, and is electrically conductive with the P-type semiconductor region 32B. The solid phase diffusion layer 34 is formed by diffusing a p-type impurity from an inner surface of the trench H1 provided in the semiconductor substrate 31. The solid phase diffusion layer 34 reduces mixing of a dark current into the photodiode PD.

In the device separator 54, the DTI includes an insulating film 54B and a metal embedded section 54A. The insulating film 54B is in contact with an inner wall of the trench H1 provided in the semiconductor substrate 31. The metal embedded section 54A is provided on an inner side of the insulating film 54B. An upper part of the metal embedded section 54A and a lower part of a metal embedded section 55A, which will be described later, are coupled to each other. A composite including the metal embedded section 54A and the metal embedded section 55A described later corresponds to one specific example of the "separator" of the present disclosure. The composite including the metal embedded section 54A and the metal embedded section 55A electrically and optically separates the sensor pixels 11. The composite including the metal embedded section 54A and the metal embedded section 55A is formed to extend from the light receiving surface 31A to the formation surface 31B. That is, the composite including the metal embedded section 54A and the metal embedded section 55A runs through the stack (the semiconductor substrate) including the semiconductor substrate 31 and the semiconductor layer 33.

The insulating film 54B is, for example, an oxide film formed by thermally oxidizing the semiconductor substrate 31. The insulating film 54B includes, for example, silicon oxide. The metal embedded section 54A is an annular metal layer that surrounds the sensor pixel 11 (in particular, the photodiode PD) in the horizontal in-plane direction. The metal embedded section 54A electrically and optically separates two sensor pixels 11 (in particular, photodiodes PD) adjacent to each other. The metal embedded section 54A is formed, for example, by CVD. The metal embedded section 54A includes, for example, aluminum or an aluminum alloy. The first substrate 30 further includes, for example, a solid phase diffusion layer 35 that is in contact with the surface of the device separator 54 (the trench H1). A conductivity type of the solid phase diffusion layer 35 is a conductivity type different from that of the N-type semiconductor region 32A, and is the P-type. The solid phase diffusion layer 35 is in contact with the P-type semiconductor region 32B, and is electrically conductive with the P-type semiconductor region 32B. The solid phase diffusion layer 35 is formed by diffusing a p-type impurity from an inner surface of the trench H1 provided in the semiconductor substrate 31. The solid phase diffusion layer 35 reduces mixing of a dark current into the photodiode PD.

The device separator 52 is formed to surround the sensor pixel 11 (in particular, the first transfer transistor TRX, the second transfer transistor TRM, the charge holding section MEM, the third transfer transistor TRG, the floating diffusion FD, and the discharge transistor OFG) in the horizontal in-plane direction. Further, the device separator 52 is formed to extend in the normal direction (the thickness direction) of the semiconductor substrate 31. The device separator 52 is provided at a position opposing the device separator 51 in the normal direction (the thickness direction) of the semiconductor substrate 31. The device separator 52 includes, for example, an insulating film 52B and a metal embedded section 52A. The insulating film 52B is in contact with an inner wall of a trench H3 provided in the semiconductor layer 33. The metal embedded section 52A is provided on an inner side of the insulating film 52B.

The insulating film 52B is, for example, an oxide film formed by thermally oxidizing the semiconductor substrate 31. The insulating film 52B includes, for example, silicon oxide. The metal embedded section 52A is an annular metal layer that surrounds the sensor pixel 11 (in particular, the first transfer transistor TRX, the second transfer transistor TRM, the charge holding section MEM, the third transfer transistor TRG, the floating diffusion FD, and the discharge transistor OFG) in the horizontal in-plane direction. The metal embedded section 52A electrically and optically separates two sensor pixels 11 (in particular, the first transfer transistors TRX, the second transfer transistors TRM, the charge holding sections MEM, the third transfer transistors TRG, the floating diffusions FD, and the discharge transistors OFG) adjacent to each other. The metal embedded section 52A is formed by, for example, CVD. The metal embedded section 52A includes, for example, aluminum or an aluminum alloy.

The device separator 55 is formed to surround the sensor pixel 11 (in particular, the first transfer transistor TRX, the second transfer transistor TRM, the charge holding section MEM, the third transfer transistor TRG, the floating diffusion FD, and the discharge transistor OFG) in the horizontal in-plane direction. Further, the device separator 55 is formed to extend in the normal direction (the thickness direction) of the semiconductor substrate 31. The device separator 55 is provided at a position opposing the device separator 54 in the normal direction (the thickness direction) of the semiconductor substrate 31. The device separator 55 includes, for example, an insulating film 55B and a metal embedded section 55A. The insulating film 55B is in contact with an inner wall of the trench H2 provided in the semiconductor layer 33. The metal embedded section 55A is provided on an inner side of the insulating film 55B.

The insulating film 55B is, for example, an oxide film formed by thermally oxidizing the semiconductor substrate 31. The insulating film 55B includes, for example, silicon oxide. The metal embedded section 55A is an annular metal layer that surrounds the sensor pixel 11 (in particular, the first transfer transistor TRX, the second transfer transistor TRM, the charge holding section MEM, the third transfer transistor TRG, the floating diffusion FD, and the discharge transistor OFG) in the horizontal in-plane direction. The metal embedded section 55A electrically and optically separates two sensor pixels 11 (in particular, the first transfer transistors TRX, the second transfer transistors TRM, the charge holding sections MEM, the third transfer transistors TRG, the floating diffusions FD, and the discharge transistors OFG) adjacent to each other. The metal embedded section 55A is formed by, for example, CVD. The metal embedded section 55A includes, for example, aluminum or an aluminum alloy.

The first substrate 30 further includes light-blocking sections 53 and 56 disposed in layers that are provided between the light receiving surface 31A and the charge holding section MEM and are different from each other. The light-blocking sections 53 and 56 are provided at positions at which the light-blocking sections 53 and 56 do not block entry, into the photoelectric conversion section MEM, of the light L having entered via the light receiving surface 31A and at which the light-blocking sections 53 and 56 do not provide a gap when viewed from the light receiving surface 31A. The light-blocking section 53 is formed to extend in the layer between the photodiode PD and the charge holding section MEM. The light-blocking section 53 has an opening 53H which the vertical gate electrode VG runs through. The light-blocking section 53 blocks entry, into the charge holding section MEM, of the light L having entered via the light receiving surface 31A at a part other than the opening 53H. The light-blocking section 56 is disposed at a position that is in a layer between the light receiving surface 31A and the light-blocking section 53 and opposes at least the opening 53H. The light-blocking section 56 blocks, together with the light-blocking section 53, the entry, into the charge holding section MEM, of the light L having entered via the light receiving surface 31A.

The light-blocking section 53 includes, for example, an insulating film 53B and a metal embedded section 53A. The insulating film 53B is in contact with an inner wall of a cavity 58 provided in the first substrate 30. The metal embedded section 53A is provided on an inner side of the insulating film 53B. The metal embedded section 53A corresponds to one specific example of a "light-blocking section" of the present disclosure.

The insulating film 53B is formed by, for example, CVD. The insulating film 53B includes, for example, a dielectric material such as $SiO_2$. The insulating film 53B is, for example, a stacked structure including a $SiO_2$ film (a silicon oxide film), a SCF film, and a $SiO_2$ film (a silicon oxide film). Note that the insulating film 53B may be a single-layer film including $SiO_2$ (silicon oxide). The metal embedded section 53A is formed by, for example, CVD. The metal embedded section 53A may be formed in a single step by, for example, CVD. The metal embedded section 53A includes, for example, aluminum or an aluminum alloy.

The metal embedded section 53A is formed in contact with an upper part of the metal embedded section 51A of the device separator 51 and a lower part of the metal embedded section 52A of the device separator 52. The metal embedded section 53A blocks entry, into the charge holding section MEM, of light having entered via the back surface (the light receiving surface 31A) of the semiconductor substrate 31. The metal embedded section 53A is disposed in a layer between the photodiode PD and the charge holding section MEM. The metal embedded section 53A is a sheet-shaped metal layer extending in the normal direction (the thickness direction) of the semiconductor substrate 31. The metal embedded section 53A has an opening 53H which the vertical gate electrode VG runs through. The insulating film 53B covers the metal embedded section 53A. The insulating film 53B insulates the metal embedded section 53A and the vertical gate electrode VG. The metal embedded section 53A and the vertical gate electrode VG are formed, for example, with the insulating film 53B and a part of the semiconductor layer 33 (hereinafter, referred to as "a semiconductor section 33A") therebetween.

The light-blocking section 56 includes, for example, an insulating film 56B and a metal embedded section 56A. The insulating film 56B is in contact with an inner wall of a cavity 57 provided in the first substrate 30. The metal embedded section 56A is provided inside the insulating film 56B. The metal embedded section 56A corresponds to one specific example of the "light-blocking section" of the present disclosure.

The insulating film 56B is formed by, for example, CVD. The insulating film 56B includes, for example, a dielectric material such as $SiO_2$. The insulating film 56B is, for example, a stack structure including a $SiO_2$ film (a silicon oxide film), a SCF film, and a $SiO_2$ film (a silicon oxide film). Note that the insulating film 56B may be a single-layer film including $SiO_2$ (silicon oxide). The metal embedded section 56A is formed by, for example, CVD. The metal embedded section 56A may be formed in a single step by, for example, CVD. The metal embedded section 56A includes, for example, aluminum or an aluminum alloy.

The metal embedded section 56A is formed in contact with an upper part of the metal embedded section 54A of the device separator 54 and a lower part of the metal embedded section 55A of the device separator 55. The metal embedded section 56A blocks entry, into the charge holding section MEM, of light having entered via the back surface (the light receiving surface 31A) of the semiconductor substrate 31. The metal embedded section 56A is disposed at a position that is in a layer between the light receiving surface 31A and the light-blocking section 53 and opposes at least the opening 53H. The metal embedded section 56A is a sheet-shaped metal layer extending in the normal direction (the thickness direction) of the semiconductor substrate 31. The insulating film 56B covers the metal embedded section 56A and insulates the metal embedded section 56A and the vertical gate electrode VG. The metal embedded section 56A and the vertical gate electrode VG is formed, for example, with the insulating film 56B and a part of the semiconductor substrate 31 therebetween.

[Manufacturing Method]

Next, a method of manufacturing the solid-state imaging unit 1 is described. FIGS. 8 to 23 illustrate an example of processes of manufacturing the solid-state imaging unit 1.

Figure 8:
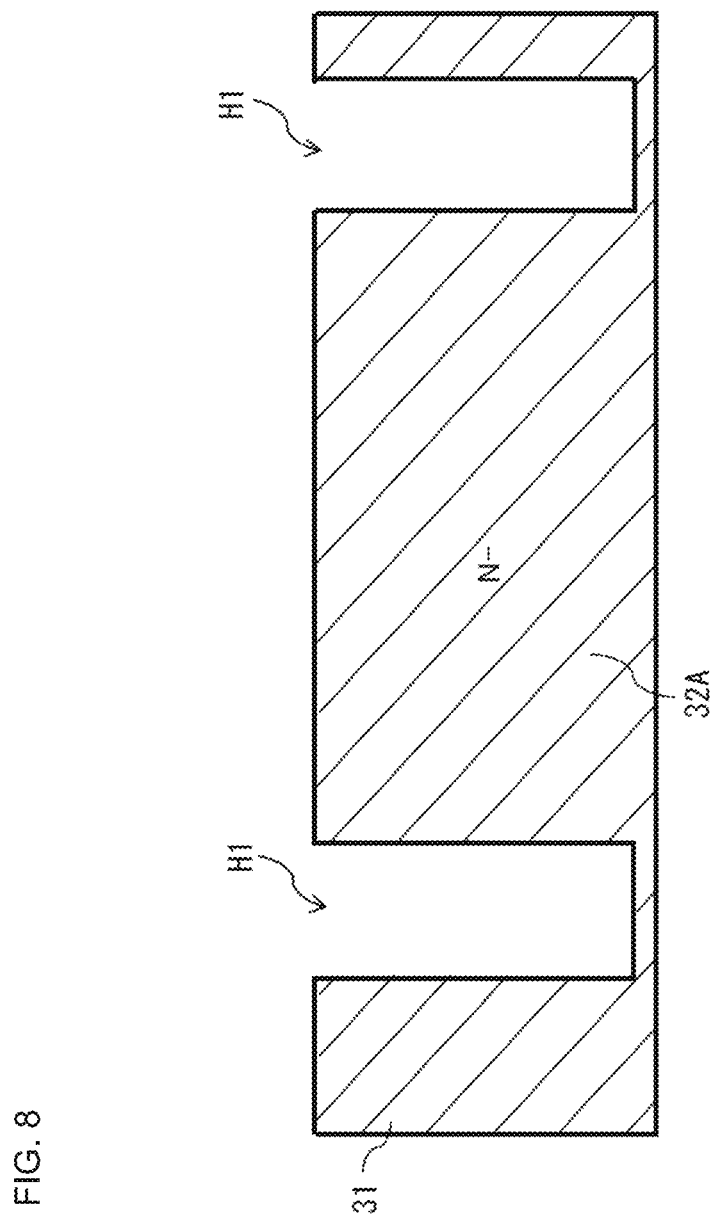
FIG. 8 is a diagram illustrating an example of a method of manufacturing the solid-state imaging unit in FIG. 1.

First, the N-type semiconductor region 32A is formed on the semiconductor substrate 31 including a silicone substrate. Subsequently, the trench H1 for pixel separation is provided in a grid shape at a predetermined part of the semiconductor substrate 31 (FIG. 8).

Figure 9:
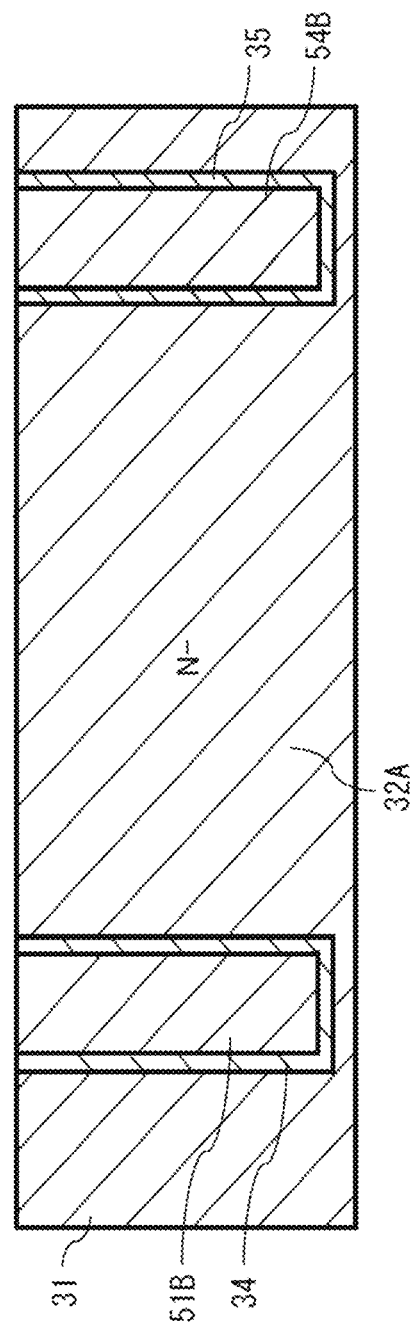
FIG. 9 is a diagram for describing a manufacturing process following FIG. 8.

Next, a silicate glass BSG film including boron is formed on the entire inner surface of the trench H1. Thereafter, boron included in the silicate glass BSG film is diffused into the semiconductor substrate 31 by heat treatment at a high temperature to form the solid phase diffusion layers 34 and 35 (FIG. 9). Next, the insulating films 51B and 54B are so formed as to fill the trench H1. Thereafter, the surface is planarized by surface polishing by CMP (Chemical Mechanical Polishing).

Figure 10:
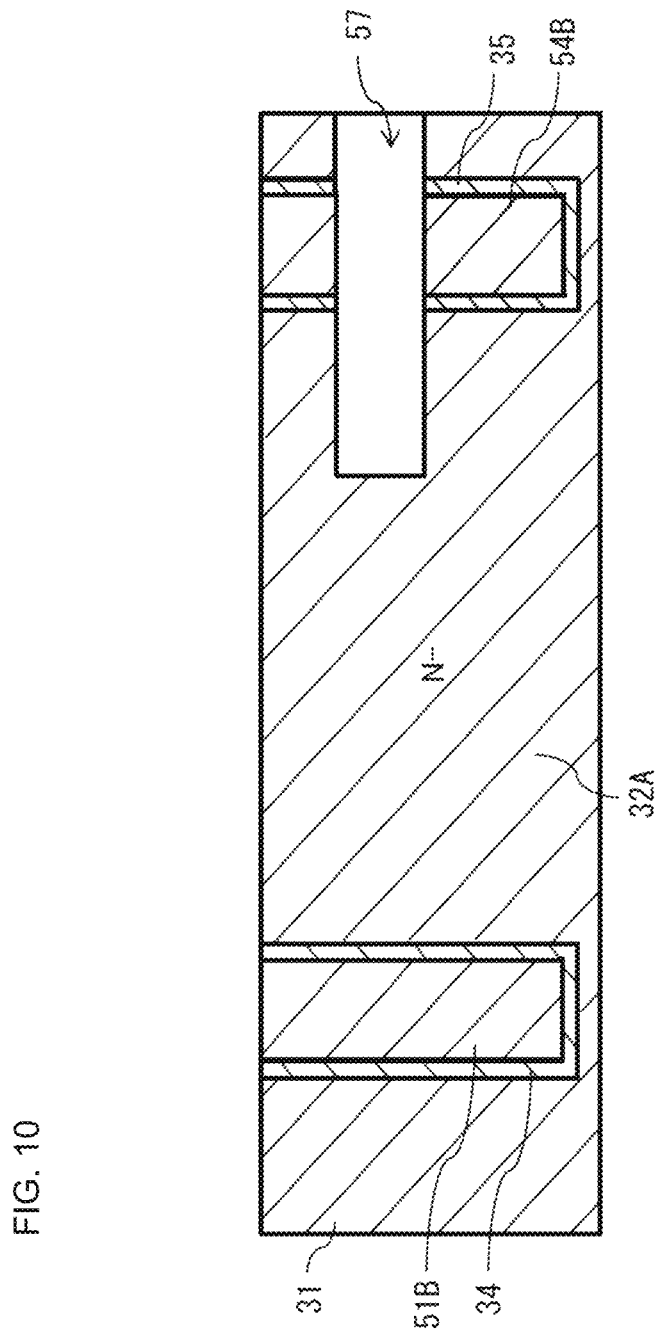
FIG. 10 is a diagram for describing a manufacturing process following FIG. 9.

Next, a sacrificial layer provided at a predetermined part in the semiconductor substrate 31 is removed by wet etching using a predetermined chemical solution. As a result, the cavity 57 extending in a stacking in-plane direction is provided at a position where the sacrificial layer has been removed (FIG. 10). As the chemical solution used at this time, for example, a mixed chemical solution of HF, $H_2O_2$, and $CH_3COOH$ is used. The sacrificial layer includes, for example, a silicon-lattice-matched material (e.g., SiGe).

Figure 11:
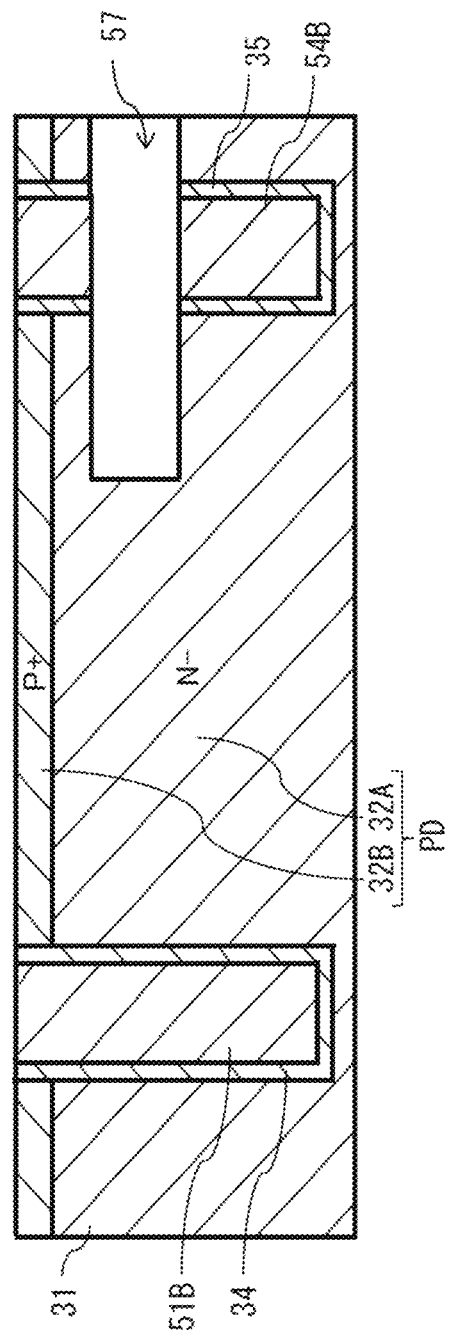
FIG. 11 is a diagram for describing a manufacturing process following FIG. 10.
Figure 12:
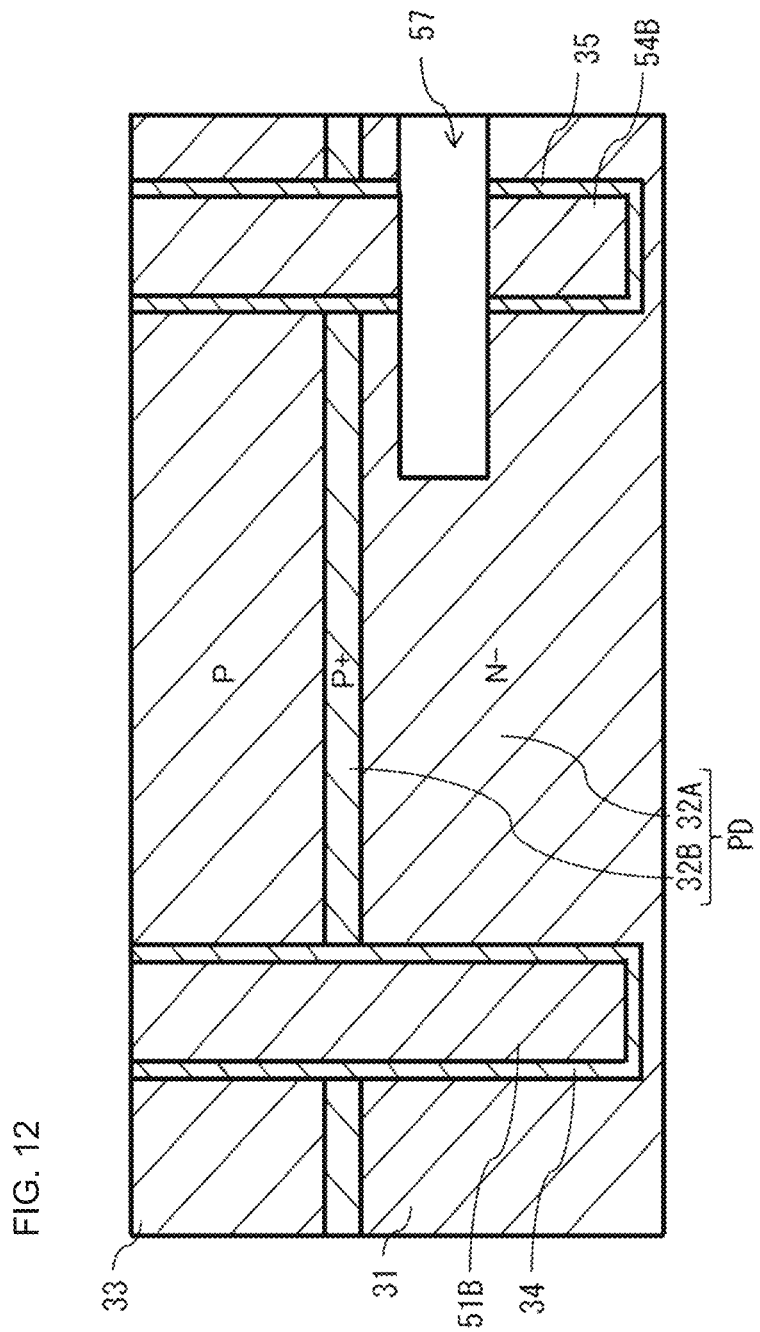
FIG. 12 is a diagram for describing a manufacturing process following FIG. 11.

Next, the P-type semiconductor region 32B is formed on an upper part of the semiconductor substrate 31 (FIG. 11). In this way, the photodiode PD is formed at a part surrounded by the trench H1 of the N-type semiconductor region 32A and the P-type semiconductor region 32B. Subsequently, by epitaxial growth, the semiconductor layer 33 is formed on the upper surface of the semiconductor substrate 31. A trench in communication with the trench H1 is provided in the trench H1, and the solid phase diffusion layers 34 and 35 and the insulating films 51B and 54B are formed in the trench (FIG. 12).

Figure 13:
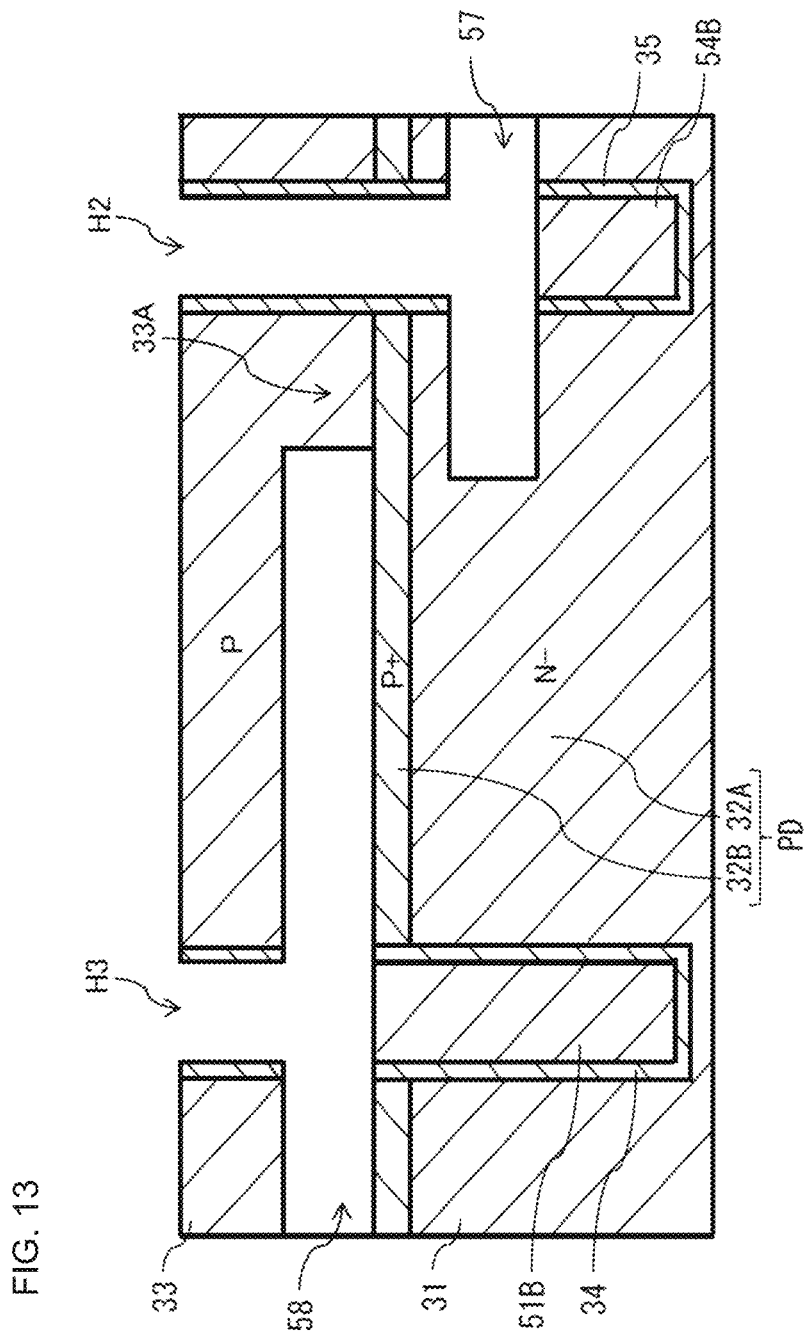
FIG. 13 is a diagram for describing a manufacturing process following FIG. 12.

Next, the sacrificial layer provided at a predetermined part in the semiconductor layer 33 is removed by wet etching using a predetermined chemical solution. As a result, the cavity 58 extending in the stacking in-plane direction is provided at a position where the sacrificial layer has been removed (FIG. 13). As the chemical solution used at this time, for example, a mixed chemical solution of HF, $H_2O_2$, and $CH_3COOH$ is used. The sacrificial layer includes, for example, a silicon-lattice-matched material (e.g., SiGe).

Next, the insulating films 51B and 54B provided in the semiconductor layer 33 are selectively removed. Thereby, the trenches H2 and H3 are provided in a lattice shape at parts opposing the trench H1. At this time, the trench H2 is so formed that the trench H2 is in communication with the cavity 57, and the trench H3 is so formed that the trench H3 is in communication with the cavity 58.

Figure 14:
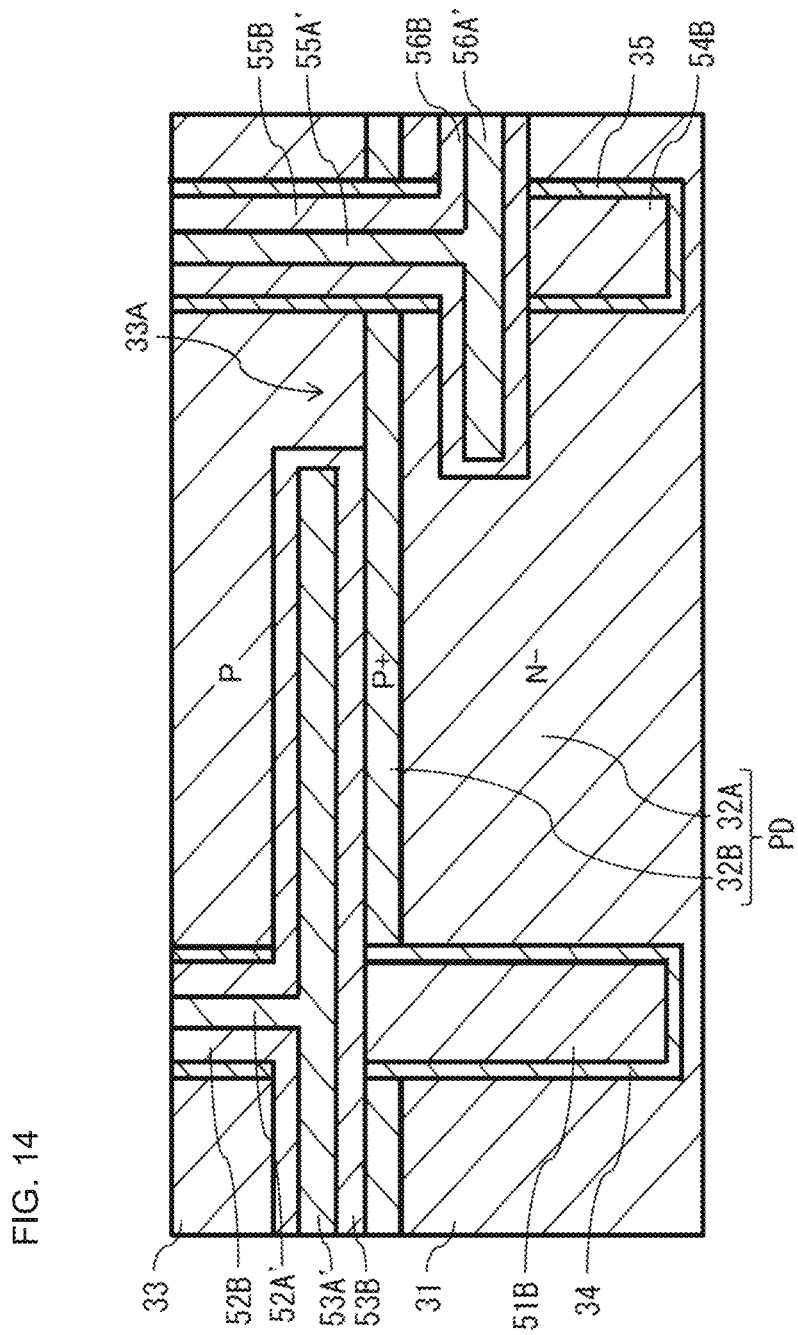
FIG. 14 is a diagram for describing a manufacturing process following FIG. 13.
Figure 15:
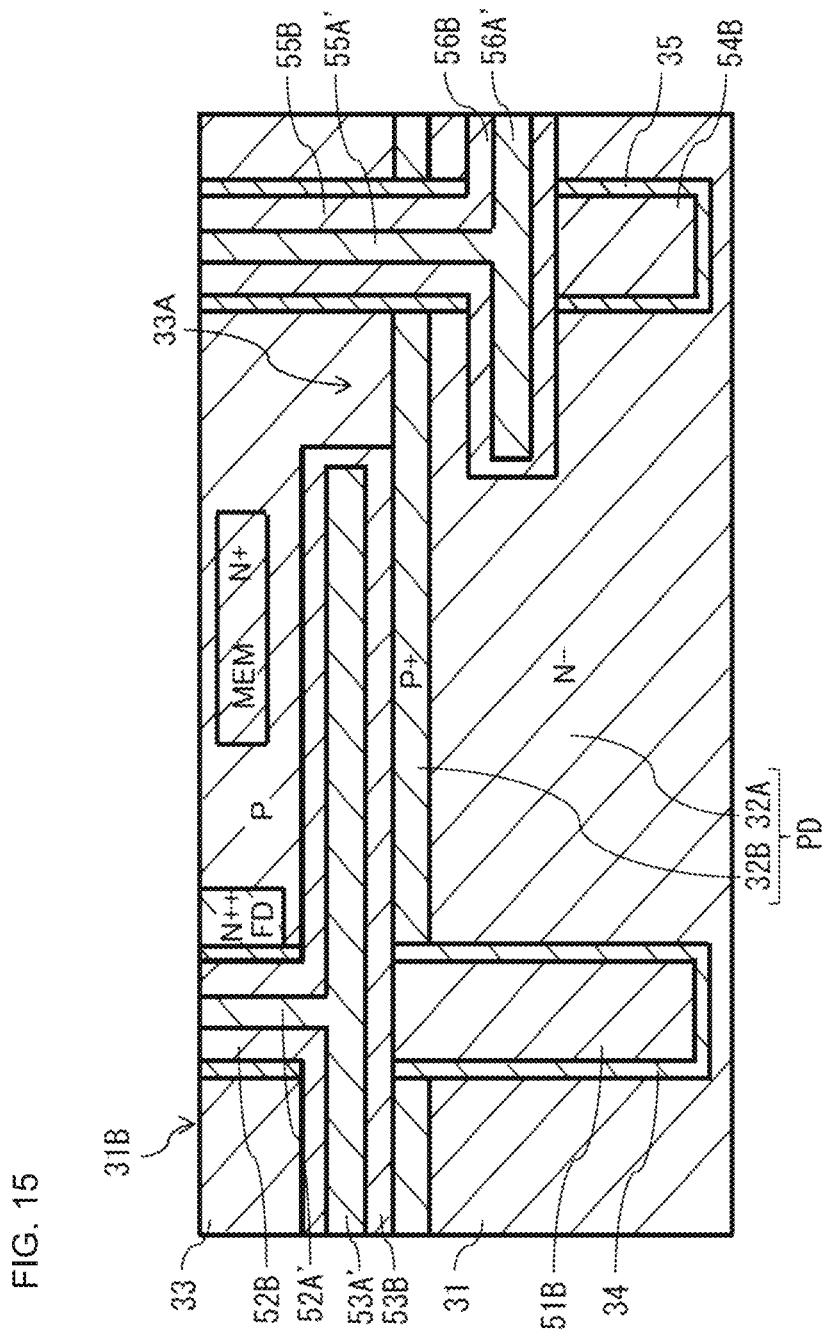
FIG. 15 is a diagram for describing a manufacturing process following FIG. 14.

Next, the insulating films 52B, 53B, 55B, and 56B are formed on the entire inner surfaces of the trenches H2 and H3 and the cavities 57 and 58. Thereafter, polysilicon layers 52A', 53A', 55A', and 56A' are so formed as to fill the trenches H2 and H3 and the cavities 57 and 58 (FIG. 14). Subsequently, the surface is planarized by surface polishing by CMP. Next, the floating diffusion FD and the charge holding section MEM are formed in the semiconductor layer 33 (FIG. 15). A surface of the semiconductor layer 33 at this time is the above-described formation surface 31B.

Figure 16:
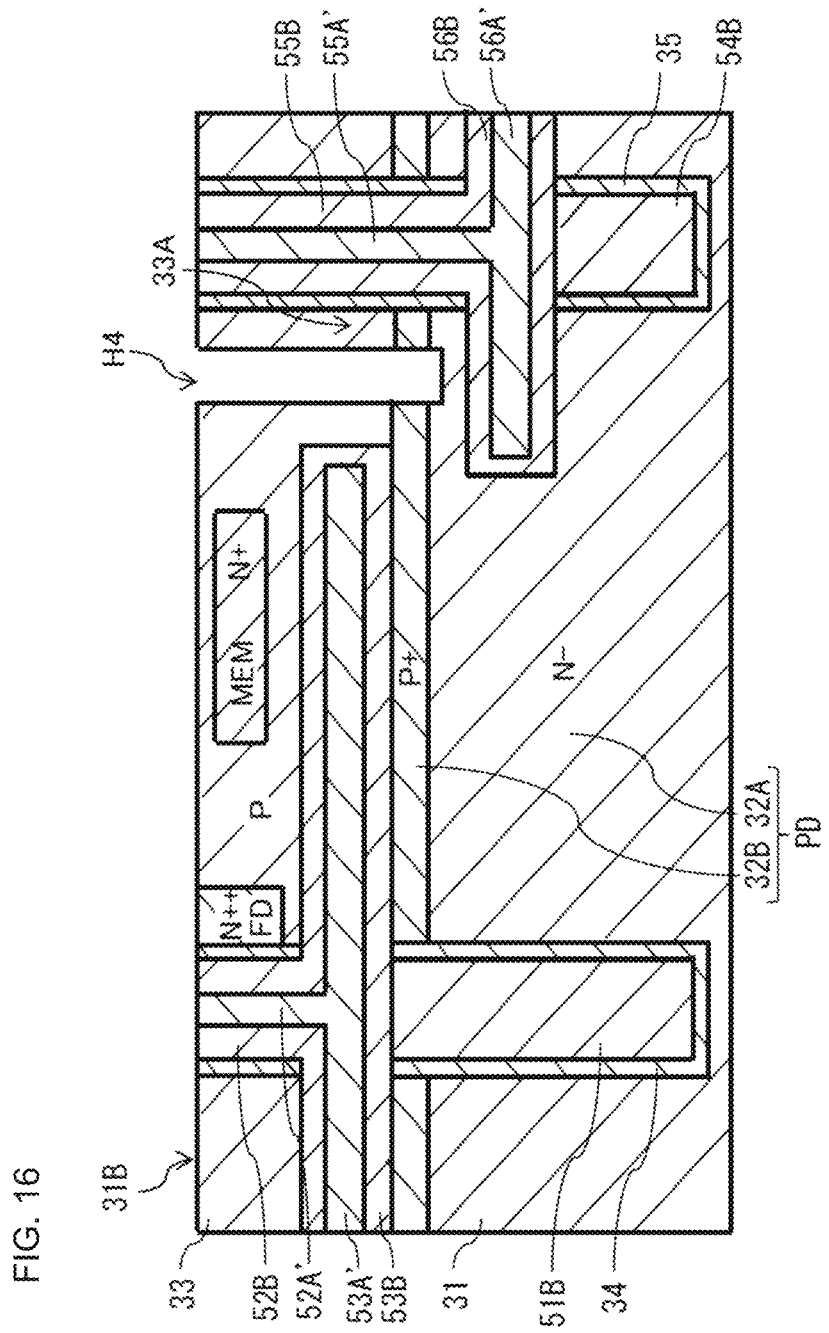
FIG. 16 is a diagram for describing a manufacturing process following FIG. 15.
Figure 17:
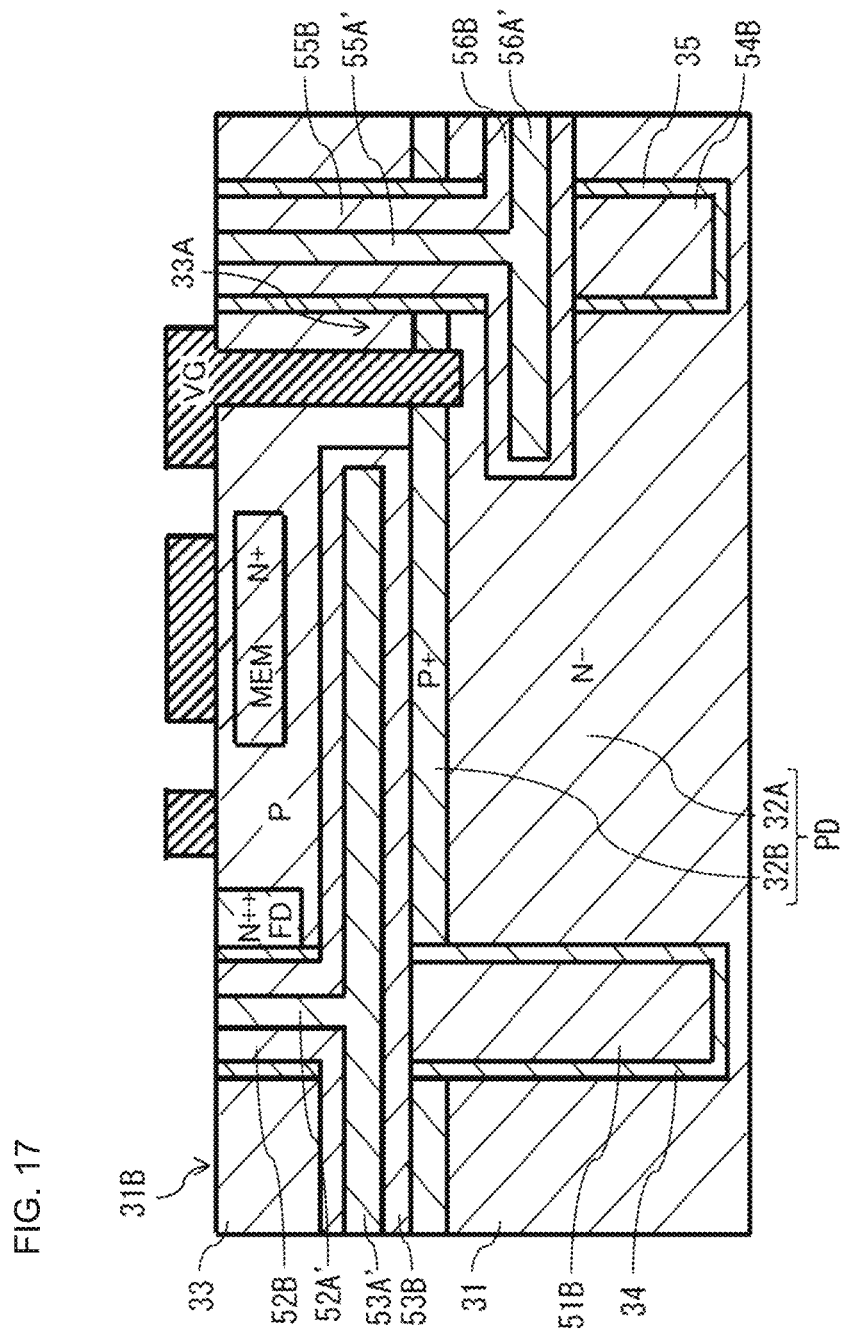
FIG. 17 is a diagram for describing a manufacturing process following FIG. 15.

Next, a trench H4 that runs through the semiconductor section 33A is formed (FIG. 16). At this time, the trench H4 is formed to a depth where a bottom surface of the trench H4 reaches the N-type semiconductor region 32A. Subsequently, the vertical gate electrode VG is so formed as to fill the trench H4 (FIG. 17). Further, the first transfer transistor TRX, the second transfer transistor TRM, the third transfer transistor TRG, and the discharge transistor OFG are formed. At this time, the vertical gate electrode VG may be formed using a metal material, or may be formed using polysilicon. At this time, the first transfer transistor TRX, the second transfer transistor TRM, the third transfer transistor TRG, and the discharge transistor OFG may be formed simultaneously with the vertical gate electrode VG.

Figure 18:
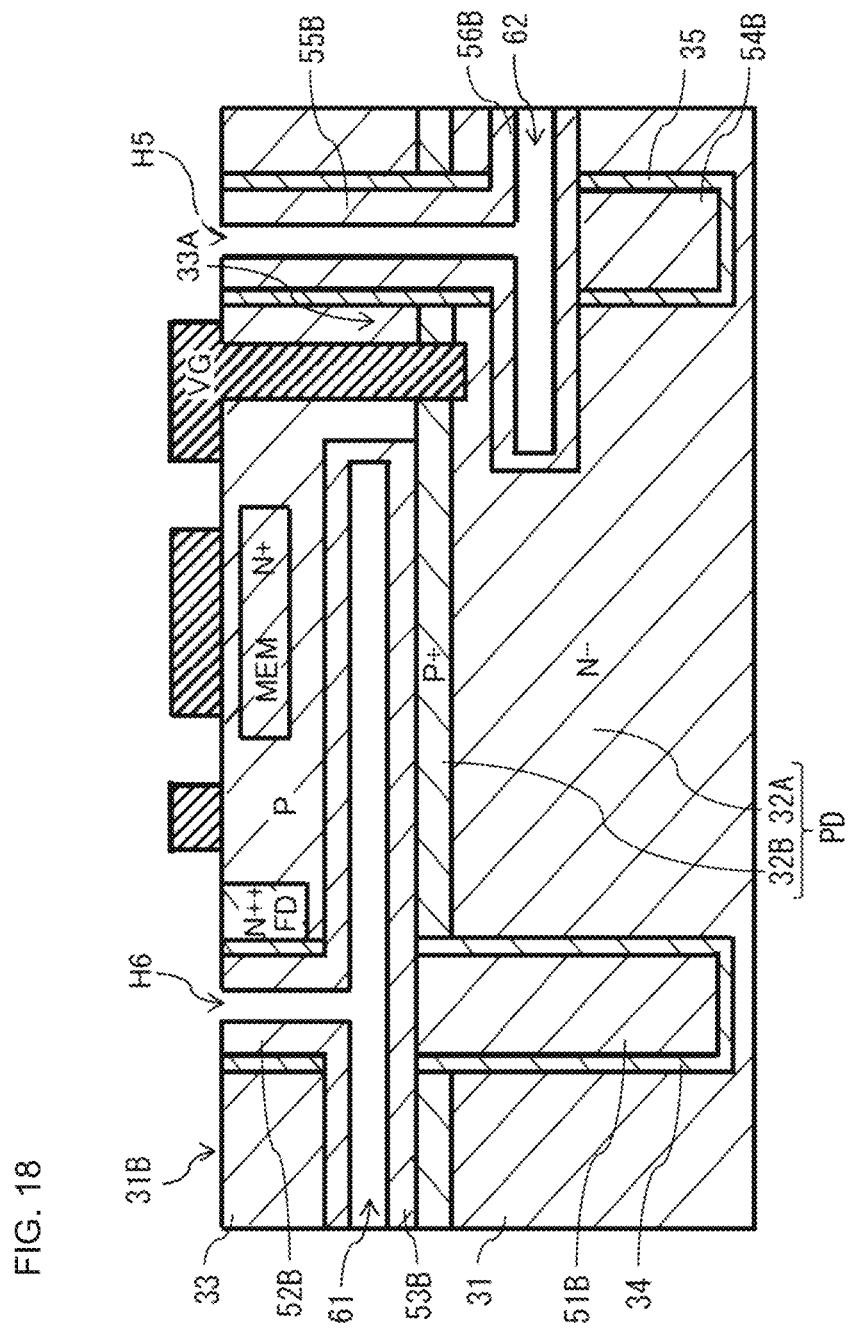
FIG. 18 is a diagram for describing a manufacturing process following FIG. 16.

Next, the polysilicon layers 52A', 53A', 55A', and 56A' are removed by, for example, wet etching using a predetermined chemical solution. As a result, a cavity 61 is provided at a position where the polysilicon layer 53A' is removed (FIG. 18). The cavity 61 extends in the stacking in-plane direction and is continuous with the trench H6. Further, a cavity 62 is provided at a position where the polysilicon layer 56A' is removed. The cavity 62 extends in the stacking direction and is continuous with the trench H5. As the chemical solution used at this time, for example, hydrofluoric acid is used. Here, the insulating films 52B, 53B, 55B, and 56B remain without being etched. Therefore, the insulating film 53B remains between the vertical gate electrode VG and the cavity 61, and the insulating film 56B remains between the vertical gate electrode VG and the cavity 62.

Figure 19:
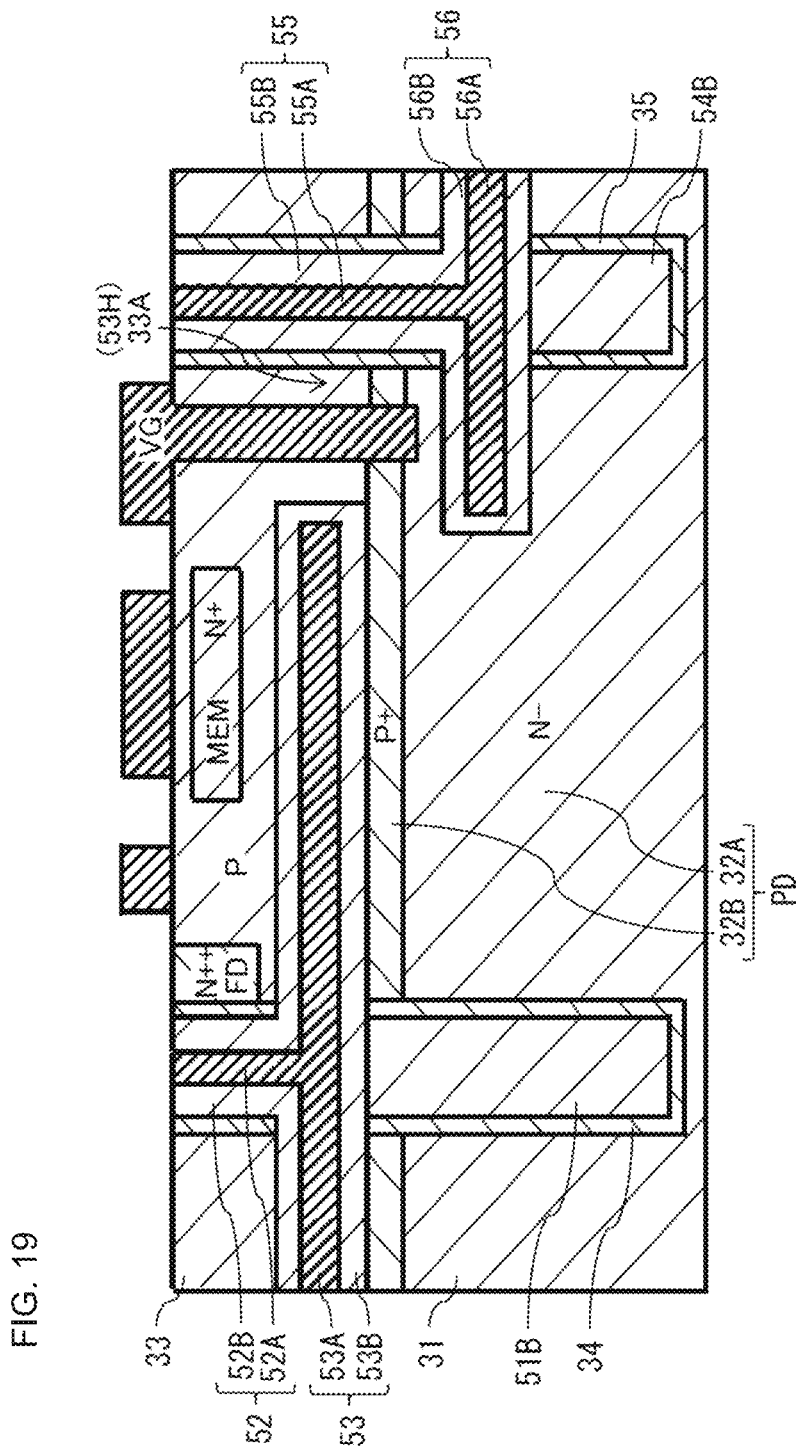
FIG. 19 is a diagram for describing a manufacturing process following FIG. 18.
Figure 20:
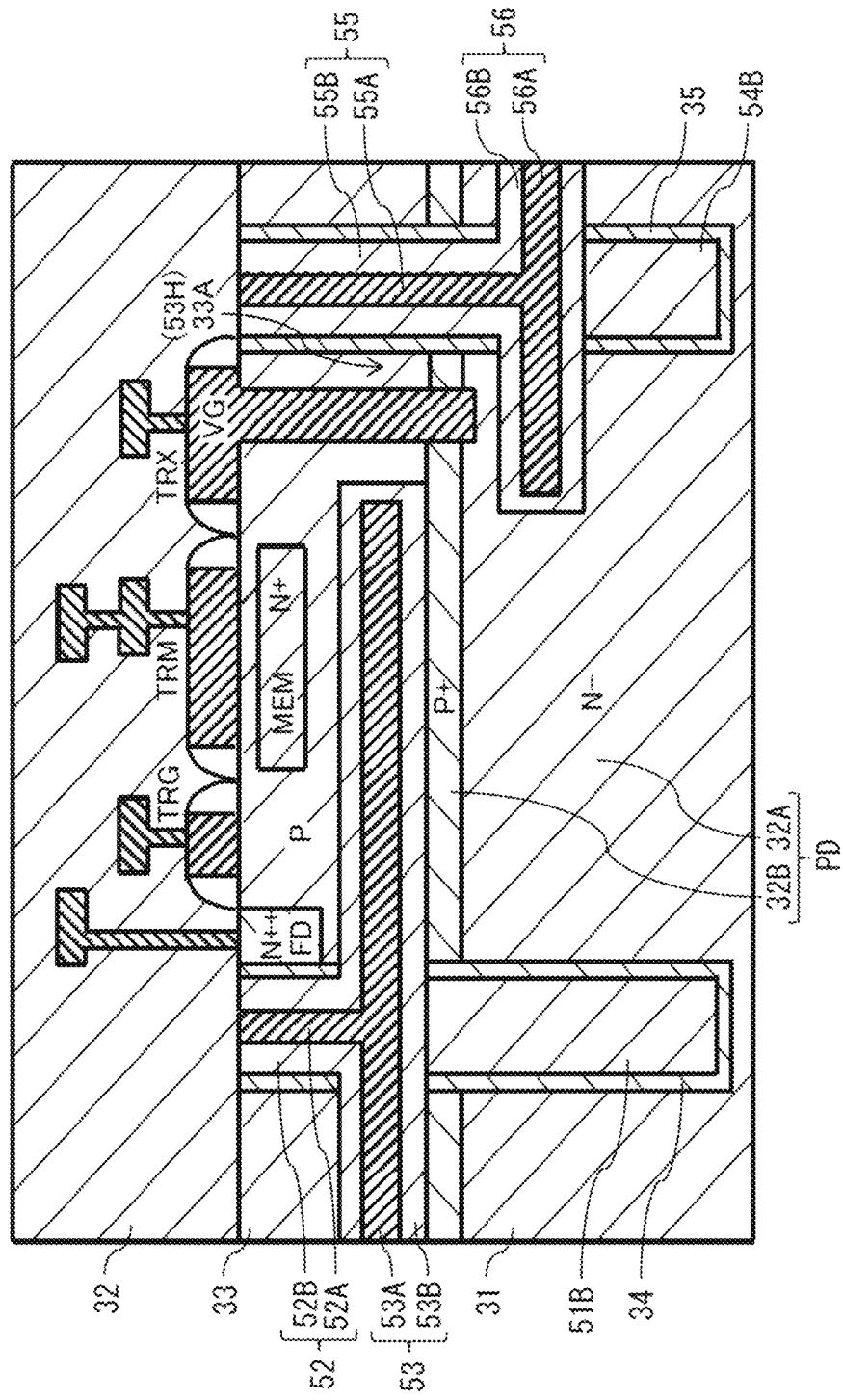
FIG. 20 is a diagram for describing a manufacturing process following FIG. 19.
Figure 21:
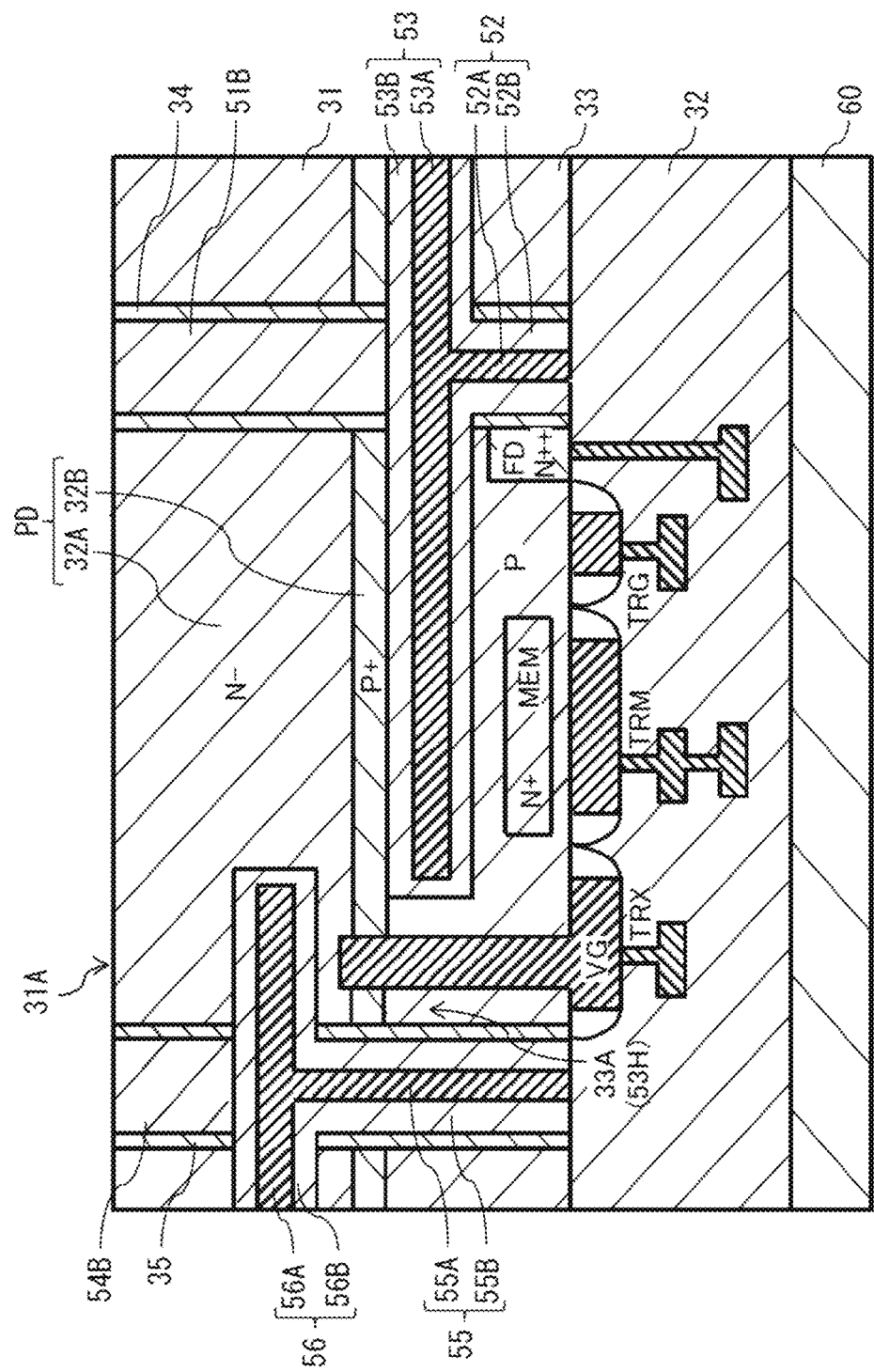
FIG. 21 is a diagram for describing a manufacturing process following FIG. 20.

Next, the metal embedded sections 52A, 53A, 55A, and 56A are so formed by, for example, CVD as to fill the trenches H5 and H6 and the cavities 61 and 62 (FIG. 19). Subsequently, the surface is planarized by surface polishing by CMP. Next, the first transfer transistor TRX, the second transfer transistor TRM, the third transfer transistor TRG, and the discharge transistor OFG are formed, and the insulating layer 32 in which they are embedded is formed (FIG. 20). Next, the support substrate 60 is adhered to the insulating layer 32. Thereafter, the back surface of the semiconductor substrate 31 is polished by CMP. Thus, the semiconductor substrate 31 is made thinner, and the insulating films 51B and 54B are exposed (FIG. 21). The back surface of the semiconductor substrate 31 at this time is the light receiving surface 31A described above.

Figure 22:
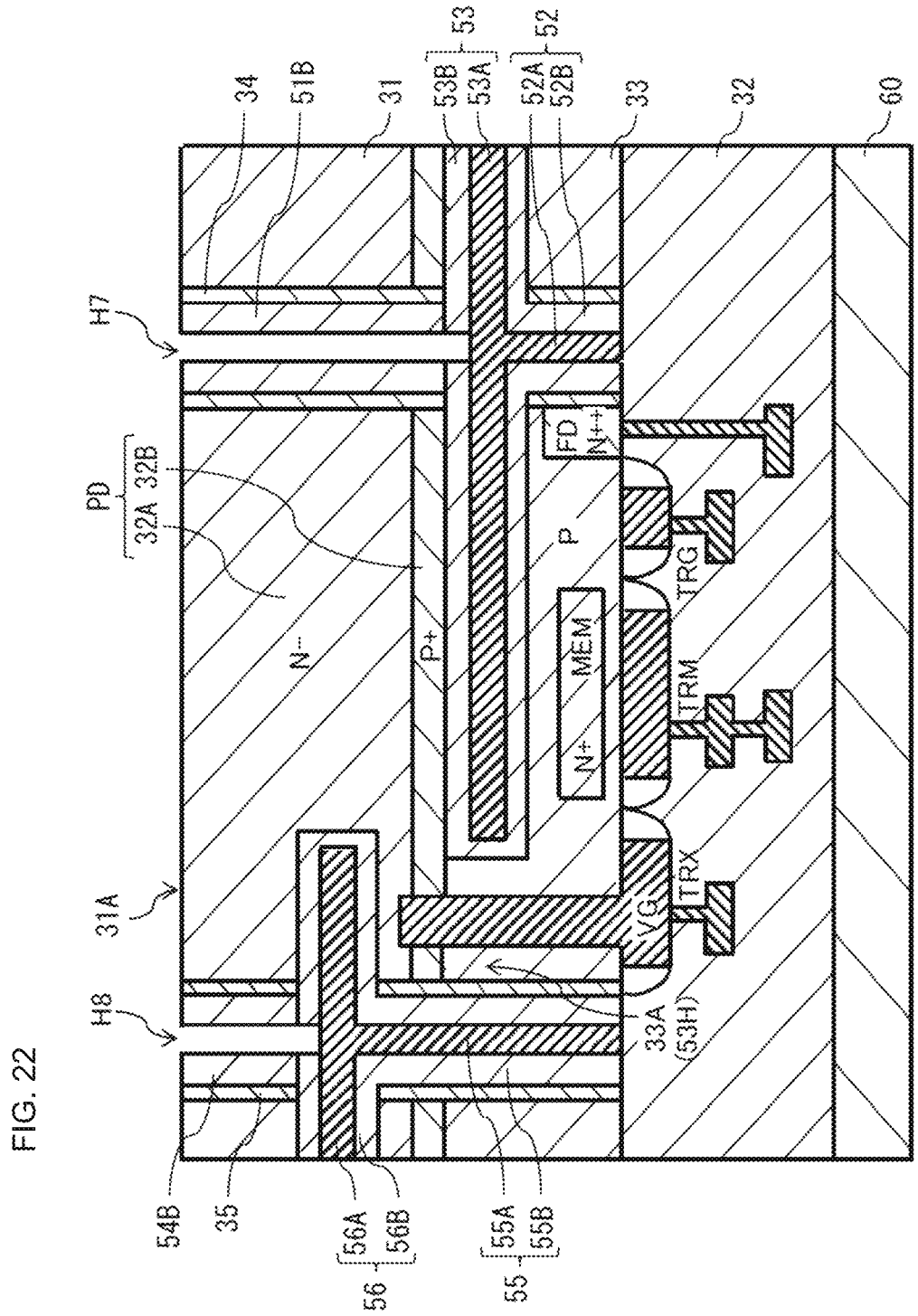
FIG. 22 is a diagram for describing a manufacturing process following FIG. 21.

Next, trenches H7 and H8 are formed in the insulating films 51B and 54B from the light receiving surface 31A side of the semiconductor substrate 31 by, for example, dry etching (FIG. 22). At this time, the trench H7 is formed to a depth at which a bottom surface of the trench H7 reaches the metal embedded section 53A, and the trench H8 is formed to a depth at which a bottom surface of the trench H8 reaches the metal embedded section 56A.

Figure 23:
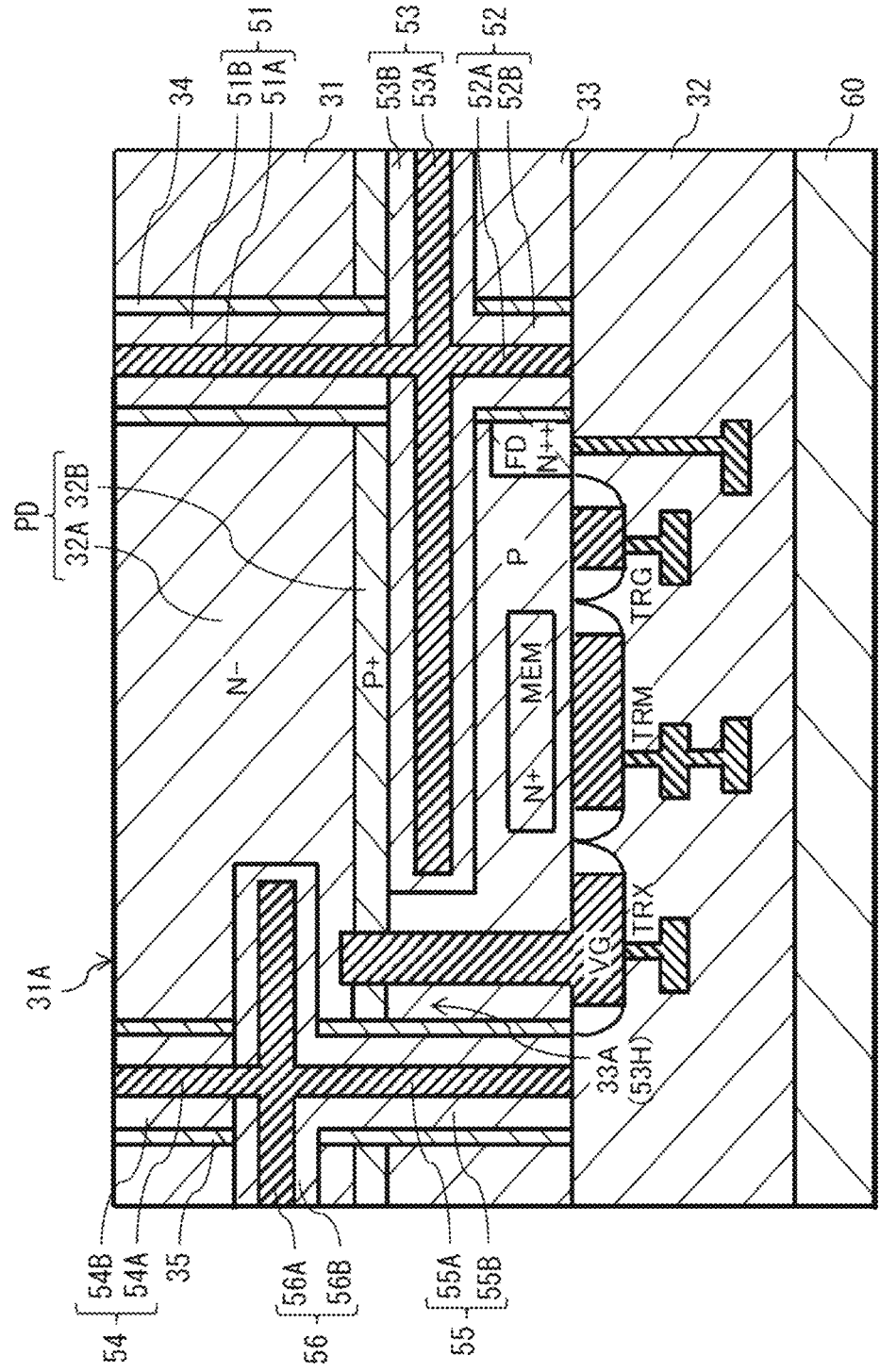
FIG. 23 is a diagram for describing a manufacturing process following FIG. 22.

Next, the metal embedded sections 54A and 51A are so formed to fill the trenches H7 and H8 by, for example, CVD (FIG. 23). Thereafter, the surface is planarized by surface polishing by CMP. Subsequently, the support substrate 60 is peeled off. Thereafter, the second substrate 40 is adhered to the insulating layer 32, and the light receiving lens 50 is adhered to the light receiving surface 31A. In this manner, the solid-state imaging unit 1 according to the present embodiment is manufactured.

[Effects]

Next, effects of the solid-state imaging unit 1 according to the present embodiment are described in comparison with a comparative example.

Figure 24:
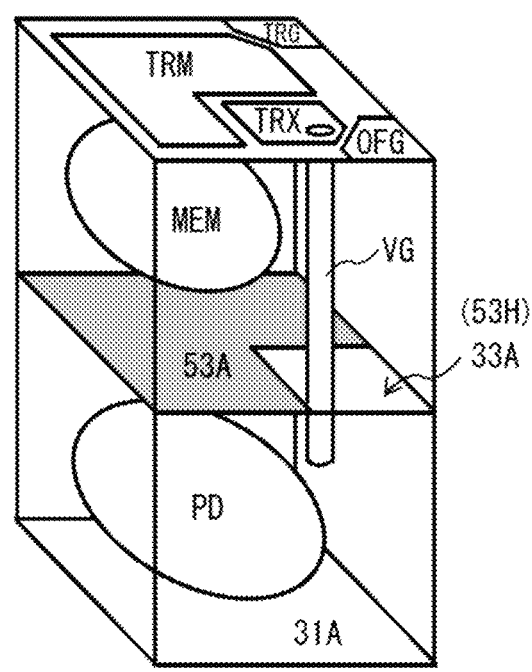
FIG. 24 is a diagram illustrating an example of a cross-sectional configuration of a sensor pixel of a solid-state imaging unit according to a comparative example.

FIG. 24 is a perspective view of an example of a schematic configuration of a pixel of a solid-state imaging unit 100 according to the comparative example. The solid-state imaging unit 100 has a configuration in which the light-blocking section 56 is omitted in the solid-state imaging unit 1 according to the present embodiment. Thus, the light-blocking section 56 is not provided in the solid-state imaging unit 100. Therefore, no structure is provided that prevents the light L having entered via the light receiving surface 31A from entering the opening 53H. Therefore, noise is generated by the light entering the charge holding section MEM via the opening 53H.

In contrast, in the present embodiment, the plurality of light-blocking sections 53 and 56 are provided that block the entry, into the charge holding section MEM, of the light L having entered via the light receiving surface 31A. Thus, it is possible to reduce entry of light into the charge holding section MEM via the opening 53H. Therefore, it is possible to reduce noise caused by the entry of the light into the charge holding section MEM.

Moreover, in the present embodiment, the metal embedded sections 51A and 52A that electrically and optically separate the sensor pixels 11 are connected to the metal embedded section 53A. Further, the metal embedded sections 54A and 55A that electrically and optically separate the sensor pixels 11 are connected to the metal embedded section 56A. As a result, it is possible to reduce the entry of light into the charge holding section MEM, as compared with a case where the metal embedded sections 51A and 52A are formed away from the metal embedded section 53A, or in a case where the metal embedded sections 54A and 55A are formed away from the metal embedded section 56A. Therefore, it is possible to reduce the noise caused by the entry of light into the charge holding section MEM.

Further, in the present embodiment, the composite including the metal embedded sections 51A and 52A and the composite including the metal embedded sections 54A and 55A are formed to extend from the light receiving surface 31A to the formation surface 31B. As a result, it is possible to reduce entry of light into the charge holding section MEM, as compared with a case where the composite including the metal embedded sections 51A and 52A or the composite including the metal embedded sections 54A and 55A are formed only in a part of the layers between the light receiving surface 31A and the formation surface 31B. Therefore, it is possible to reduce the noise caused by the entry of light into the charge holding section MEM.

[2. Modifications]

Hereinafter, modifications of the solid-state imaging unit 1 according to the above-described embodiment is described.

In the above-described embodiment, the vertical gate electrode VG has a rod shape. However, in the above-described embodiment, the vertical gate electrode VG may include walls VGa and Vgb, for example, as illustrated in FIGS. 25 and 26. The walls VGa and Vgb block entry, into the charge holding section MEM, of the light having entered via the light receiving surface 31A. The wall VGa and the wall VGb are disposed along an end, of the opening 53H of the metal embedded section 53A, closer to the charge holding section MEM. In this case, it is possible to block the entry, into the charge holding section MEM, of the light having entered via the light receiving surface 31A by the walls VGa and Vgb. Therefore, it is possible to reduce the noise caused by entry of light into the charge holding section MEM.

<3. Application Example>

FIG. 27 illustrates an example of a schematic configuration of an imaging system 2 including the solid-state imaging unit 1 according to the embodiment and its modifications described above. The imaging system 2 corresponds to one specific example of an "electronic apparatus" of the present disclosure. The imaging system 2 includes, for example, an optical system 210, the solid-state imaging unit 1, a signal processing circuit 220, and a display section 230.

The optical system 210 forms an image of image light (entering light) from a subject on an imaging plane of the solid-state imaging unit 1. The solid-state imaging unit 1 receives the image light (the entering light) entering from the solid-state imaging unit 1, and supplies a pixel signal based on the received image light (the entering light) to the signal processing circuit 220. The signal processing circuit 220 processes the image signal supplied from the solid-state imaging unit 1 to generate image data. Further, the signal processing circuit 220 generates an image signal corresponding to the generated image data, and supplies it to the display section 230. The display section 230 displays an image based on the image signal supplied from the signal processing circuit 220.

In this application example, the solid-state imaging unit 1 according to any of the embodiment and its modifications described above is applied to the imaging system 2. As a result, it is possible to reduce the size of the solid-state imaging unit 1 or increase definition of the solid-state imaging unit 1. Therefore, it is possible to provide a compact or high-definition imaging system 2.

<6. Examples of Application to Mobile Body>

The technology (the present technology) according to the present disclosure is applicable to various products. For example, the technology according to the present disclosure may be implemented as a device mounted on any type of mobile body such as an automobile, an electric vehicle, a hybrid electric vehicle, a motorcycle, a bicycle, a personal mobility, an airplane, a drone, a vessel, or a robot.

FIG. 28 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 28, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 28, an audio speaker 12061, a display section 12062, and an instrument panel 12063 are illustrated as the output device. The display section 12062 may, for example, include at least one of an on-board display and a head-up display.

FIG. 29 is a diagram depicting an example of the installation position of the imaging section 12031.

In FIG. 29, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 29 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Examples of the mobile body control system to which the technology according to the present disclosure is applicable have been described above. The technology according to the present disclosure is applicable to the imaging section 12031 of the configuration described above. Specifically, the solid-state imaging unit 1 according to the embodiment and its modifications described above is applicable to the imaging section 12031. Applying the technology according to the present disclosure to the imaging unit 12031 makes it possible to obtain a less-noise and high-definition captured image. Therefore, it is possible to carry out a highly precise control using the captured image in the mobile body control system.

The present disclosure has been described above with reference to the embodiment, the modifications, the application examples, and the examples of application thereof. The present disclosure is, however, not limited to the embodiment and the like described above, and a variety of modifications may be made. It should be noted that the effects described herein are mere examples. The effects of the present disclosure are not limited to the effects described herein. The present disclosure may have any effect other than the effects described herein.

Moreover, the present disclosure is allowed to have any of the following configurations.

(1)
A solid-state imaging unit including:
a light receiving surface;
a light receiving surface; and
two or more pixels disposed to oppose the light receiving surface, wherein
the two or more pixels each include
a photoelectric conversion section that performs photoelectric conversion on light having entered via the light receiving surface,
a charge holding section that holds a charge transferred from the photoelectric conversion section,
a transfer transistor that includes a vertical gate electrode reaching the photoelectric conversion section, the transfer transistor transferring the charge from the photoelectric conversion section to the charge holding section, and
two or more light-blocking sections disposed in layers that are provided between the light receiving surface and the charge holding section and are different from each other, and
the two or more light-blocking sections are provided at positions at which the two or more light-blocking sections do not block entry, into the photoelectric conversion section, of the light having entered via the light receiving surface and at which the two or more light-blocking sections do not provide a gap when viewed from the light receiving surface.

(2)
The solid-state imaging unit according to (1), in which the two or more light-blocking sections include
a first light-blocking section disposed in a layer between the photoelectric conversion section and the charge holding section, the first light-blocking section having an opening which the vertical gate electrode runs through, the first light-blocking section blocking, at a part other than the opening, entry, into the charge holding section, of the light having entered via the light receiving surface, and
a second light-blocking section disposed at a position that is in a layer between the light receiving surface and the first light-blocking section and opposes at least the opening, the second light-blocking section blocking the entry, into the charge holding section, of the light having entered via the light receiving surface.

(3)
The solid-state imaging unit according to (2), in which the vertical gate electrode includes a wall that blocks entry, into the charge holding section, of the light having entered via the light receiving surface.

(4)
The solid-state imaging unit according to any one of (1) to (3), further including a separator that is joined to the first light-blocking section and the second light-blocking section, the separator electrically and optically separating the pixels.

(5)
The solid-state imaging unit according to (4), further including
a semiconductor substrate that includes the light receiving surface and a formation surface of the transfer transistor, and on which each of the pixels is formed, in which the separator is formed to extend from the light receiving surface to the formation surface.

(6)
An electronic apparatus including:
a solid-state imaging unit that outputs a pixel signal based on entering light; and
a signal processing circuit that processes the pixel signal, the solid-state imaging unit including
a light receiving surface, and
two or more pixels disposed to oppose the light receiving surface, in which
the two or more pixels each include
a photoelectric conversion section that performs photoelectric conversion on light having entered via the light receiving surface,
a charge holding section that holds a charge transferred from the photoelectric conversion section,
a transfer transistor that includes a vertical gate electrode reaching the photoelectric conversion section, the transfer transistor transferring the charge from the photoelectric conversion section to the charge holding section, and
two or more light-blocking sections disposed in layers that are provided between the light receiving surface and the charge holding section and are different from each other, and
the two or more light-blocking sections are provided at positions at which the two or more light-blocking sections do not block entry, into the photoelectric conversion section, of the light having entered via the light receiving surface and at which the two or more light-blocking sections do not provide a gap when viewed from the light receiving surface.

The present application claims priority based on Japanese Patent Application No. 2018-172282 filed with the Japan Patent Office on Sep. 14, 2018, the entire content of which is incorporated herein by reference.

It should be understood that those skilled in the art would make various modifications, combinations, sub-combinations, and alterations depending on design requirements and other factors, and they are within the scope of the attached claims or the equivalents thereof.

What is claimed is:
1. A solid-state imaging unit, comprising:
a light receiving surface; and
two or more pixels disposed to oppose the light receiving surface, wherein the two or more pixels each include:
a photoelectric conversion section that performs photoelectric conversion on light having entered via the light receiving surface;
a charge holding section that holds a charge transferred from the photoelectric conversion section;
a transfer transistor that includes a vertical gate electrode reaching the photoelectric conversion section, the transfer transistor transferring the charge from the photoelectric conversion section to the charge holding section; and
two or more light-blocking sections disposed in layers that are provided between the light receiving surface and the charge holding section and are different from each other,
wherein the two or more light-blocking sections are provided at positions at which the two or more light-blocking sections do not block entry, into the photoelectric conversion section, of the light having entered via the light receiving surface and at which the two or more light-blocking sections do not provide a gap when viewed from the light receiving surface, and wherein the two or more light-blocking sections include:
a first light-blocking section disposed in a layer between the photoelectric conversion section and the charge holding section, the first light-blocking section having an opening which the vertical gate electrode runs through, the first light-blocking section blocking, at a part other than the opening, entry, into the charge holding section, of the light having entered via the light receiving surface, and
a second light-blocking section disposed at a position that is in a layer between the light receiving surface and the first light-blocking section and opposes at least the opening, the second light-blocking section blocking the entry, into the charge holding section, of the light having entered via the light receiving surface.

2. The solid-state imaging unit according to claim 1, wherein the vertical gate electrode includes a wall that blocks entry, into the charge holding section, of the light having entered via the light receiving surface.

3. The solid-state imaging unit according to claim 1, further comprising:
a separator that is joined to a first of the two or more light-blocking sections and to a second of the two or more light-blocking sections, the separator electrically and optically separating the two or more pixels.

4. The solid-state imaging unit according to claim 3, further comprising:
a semiconductor substrate that includes the light receiving surface and a formation surface of the transfer transistor, and on which each of the two or more pixels is formed,
wherein the separator is formed to extend from the light receiving surface to the formation surface.

5. A solid-state imaging unit, comprising:
a light receiving surface; and
two or more pixels disposed to oppose the light receiving surface, wherein the two or more pixels each include:
a photoelectric conversion section that performs photoelectric conversion on light having entered via the light receiving surface;
a charge holding section that holds a charge transferred from the photoelectric conversion section;
a transfer transistor that includes a vertical gate electrode reaching the photoelectric conversion section, the transfer transistor transferring the charge from the photoelectric conversion section to the charge holding section; and
two or more light-blocking sections disposed in layers that are provided between the light receiving surface and the charge holding section and are different from each other,
wherein the two or more light-blocking sections are provided at positions at which the two or more light-blocking sections do not block entry, into the photoelectric conversion section, of the light having entered via the light receiving surface and at which the two or more light-blocking sections do not provide a gap when viewed from the light receiving surface; and
a separator that is joined to a first of the two or more light-blocking sections and to a second of the two or more light-blocking sections, the separator electrically and optically separating the two or more pixels.

6. The solid-state imaging unit according to claim 5, further comprising:
a semiconductor substrate that includes the light receiving surface and a formation surface of the transfer transistor, and on which each of the two or more pixels is formed,
wherein the separator is formed to extend from the light receiving surface to the formation surface.

7. The solid-state imaging unit according to claim 5, wherein the vertical gate electrode includes a wall that blocks entry, into the charge holding section, of the light having entered via the light receiving surface.

8. An electronic apparatus, comprising:
a solid-state imaging unit that outputs a pixel signal based on entering light; and
a signal processing circuit that processes the pixel signal, the solid-state imaging unit including:
a light receiving surface, and
two or more pixels disposed to oppose the light receiving surface, wherein the two or more pixels each include:
a photoelectric conversion section that performs photoelectric conversion on light having entered via the light receiving surfaces;
a charge holding section that holds a charge transferred from the photoelectric conversion sections;
a transfer transistor that includes a vertical gate electrode reaching the photoelectric conversion section, the transfer transistor transferring the charge from the photoelectric conversion section to the charge holding sections; and
two or more light-blocking sections disposed in layers that are provided between the light receiving surface and the charge holding section and are different from each other,
wherein the two or more light-blocking sections are provided at positions at which the two or more light-blocking sections do not block entry, into the photoelectric conversion section, of the light having entered via the light receiving surface and at which the two or more light-blocking sections do not provide a gap when viewed from the light receiving surface, and
wherein the two or more light-blocking sections include:
a first light-blocking section disposed in a layer between the photoelectric conversion section and the charge holding section, the first light-blocking section having an opening which the vertical gate electrode runs through, the first light-blocking section blocking, at a part other than the opening, entry, into the charge holding section, of the light having entered via the light receiving surface, and
a second light-blocking section disposed at a position that is in a layer between the light receiving surface and the first light-blocking section and opposes at least the opening, the second light-blocking section blocking the entry, into the charge holding section, of the light having entered via the light receiving surface.

* * * * *